United States Patent
Hatakeyama et al.

(10) Patent No.: US 9,804,492 B2
(45) Date of Patent: *Oct. 31, 2017

(54) METHOD FOR FORMING MULTI-LAYER FILM AND PATTERNING PROCESS

(71) Applicant: SHIN-ETSU CHEMICAL CO., LTD., Tokyo (JP)

(72) Inventors: Jun Hatakeyama, Jyoetsu (JP); Tsutomu Ogihara, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 43 days.

This patent is subject to a terminal disclaimer.

(21) Appl. No.: 14/857,231

(22) Filed: Sep. 17, 2015

(65) Prior Publication Data

US 2016/0111287 A1    Apr. 21, 2016

(30) Foreign Application Priority Data

Oct. 16, 2014  (JP) ................. 2014-211611

(51) Int. Cl.

| | | |
|---|---|---|
| G03F 7/09 | (2006.01) | |
| H01L 21/033 | (2006.01) | |
| H01L 21/02 | (2006.01) | |
| H01L 21/311 | (2006.01) | |
| H01L 21/3213 | (2006.01) | |

(52) U.S. Cl.
CPC .......... *G03F 7/094* (2013.01); *H01L 21/0212* (2013.01); *H01L 21/02115* (2013.01); *H01L 21/02118* (2013.01); *H01L 21/02126* (2013.01); *H01L 21/02181* (2013.01); *H01L 21/02186* (2013.01); *H01L 21/02189* (2013.01); *H01L 21/02216* (2013.01); *H01L 21/02282* (2013.01); *H01L 21/0332* (2013.01); *H01L 21/31116* (2013.01); *H01L 21/31122* (2013.01); *H01L 21/31138* (2013.01); *H01L 21/31144* (2013.01); *H01L 21/32139* (2013.01)

(58) Field of Classification Search
CPC ...................................................... G03F 7/094
See application file for complete search history.

(56) References Cited

U.S. PATENT DOCUMENTS

| | | |
|---|---|---|
| 2004/0241577 A1 | 12/2004 | Hatakeyama et al. |
| 2004/0259037 A1 | 12/2004 | Hatakeyama et al. |
| 2005/0227482 A1 | 10/2005 | Korzenski et al. |
| 2006/0014106 A1 | 1/2006 | Hatakeyama et al. |
| 2006/0019195 A1 | 1/2006 | Hatakeyama et al. |
| 2006/0204891 A1 | 9/2006 | Hatakeyama |
| 2007/0122740 A1 | 5/2007 | Hatakeyama et al. |
| 2007/0238300 A1 | 10/2007 | Ogihara et al. |
| 2007/0275325 A1 | 11/2007 | Hatakeyama et al. |

(Continued)

FOREIGN PATENT DOCUMENTS

| | | |
|---|---|---|
| JP | 2004-205658 A | 7/2004 |
| JP | 2004-205676 A | 7/2004 |

(Continued)

OTHER PUBLICATIONS

Yao, Huirong. "New Spin-on Metal Hardmask Materials for Lithography Processes," Proc. of SPIE, vol. 8682, pp. 86820S-2-10, 2013.
Lynch, Tom. "Properties and Performance of Near UV Reflectivity Control Layers," Proc. of SPIE, vol. 2195, pp. 225-229, 1994.
Apr. 13, 2016 Office Action issued in Taiwanese Patent Application No. 104133441.

*Primary Examiner* — Kathleen Duda
(74) *Attorney, Agent, or Firm* — Oliff PLC

(57) ABSTRACT

A method for forming multi-layer film on substrate, which includes steps (1) forming under layer film on substrate by applying under layer film material containing resin having repeating unit represented by the general formula (1) or (2) in which fluorene structure is contained, and curing the same by heat treatment, (2) forming metal oxide film on the under layer film by applying metal oxide film material selected from titanium oxide film material, zirconium oxide film material, and hafnium oxide film material, (3) forming hydrocarbon film on metal oxide film by applying hydrocarbon film material, and (4) forming silicon oxide film on the hydrocarbon film by applying silicon oxide film material. There can be provided a method for forming multi-layer film that can reduce reflectance, and useful for a patterning process with high dimensional accuracy of dry etching.

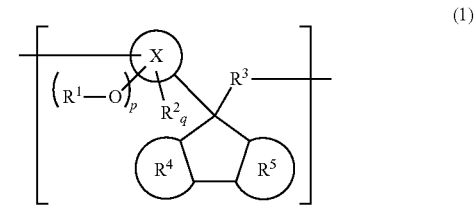

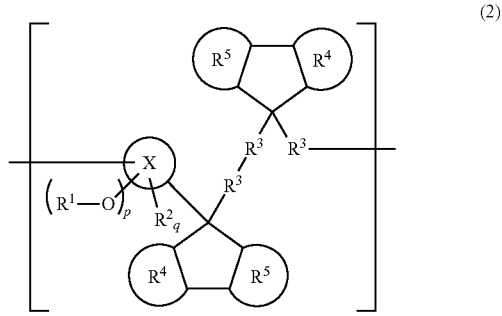

20 Claims, 6 Drawing Sheets

(56) References Cited

U.S. PATENT DOCUMENTS

| | | |
|---|---|---|
| 2008/0118860 A1 | 5/2008 | Harada et al. |
| 2010/0099044 A1 | 4/2010 | Hatakeyama et al. |
| 2012/0077345 A1 | 3/2012 | Saito et al. |
| 2012/0252218 A1 | 10/2012 | Kori et al. |
| 2014/0193757 A1 | 7/2014 | Ogihara et al. |
| 2014/0242502 A1* | 8/2014 | Tsuchimura ............ C08F 12/22 430/5 |
| 2014/0273447 A1 | 9/2014 | Ogihara et al. |
| 2014/0363768 A1 | 12/2014 | Kinsho et al. |

FOREIGN PATENT DOCUMENTS

| | | |
|---|---|---|
| JP | 2004-205685 A | 7/2004 |
| JP | 2005-250434 A | 9/2005 |
| JP | 2006-227391 A | 8/2006 |
| JP | 2006-259249 A | 9/2006 |
| JP | 2006-259482 A | 9/2006 |
| JP | 2006-285095 A | 10/2006 |
| JP | 2007-199653 A | 8/2007 |
| JP | 2008-026600 A | 2/2008 |
| JP | 2008096684 A | 4/2008 |
| JP | 2012-77295 A | 4/2012 |
| JP | 2012-214720 A | 11/2012 |
| JP | 2014-178602 A | 9/2014 |
| WO | 2010/147155 A1 | 12/2010 |

* cited by examiner

PENTA-LAYER: RESIST FILM/SILICON OXIDE FILM (n=1.6, k=0.2)/
HYDROCARBON FILM (n=1.5, k=0.3)/TITANIUM OXIDE FILM (n=1.6,
k=0.7; 30nm)/UNDER LAYER FILM (n=1.4, k=0.4; 100nm)

METHOD FOR FORMING MULTI-LAYER FILM AND PATTERNING PROCESS

BACKGROUND OF THE INVENTION

Field of the Invention

The present invention relates to a method for forming a multi-layer film useful as a resist under layer film to be used for fine processing in the manufacturing process of a semiconductor device, etc., and to a patterning process using a multi-layer film formed by the method for forming a multi-layer film.

Description of the Related Art

In recent years, as LSI (Large-Scale Integrated circuit) progresses toward high integration and high speed, a finer pattern rule is being requested. Under such circumstances, the lithography using a light exposure, which has been currently used as a general technology, is approaching the essential limit of resolution derived from the wavelength of a light source.

As the light source for lithography to be used for formation of a resist pattern, g-beam (436 nm) or i-beam (365 nm) of a mercury lamp, KrF excimer laser (248 nm), ArF excimer laser (193 nm), etc., have been widely used, and a double patterning has been investigated for finer patterning.

The double patterning is a technology that is capable of doubling the resolution of a resist, and further facilitate miniaturization of devices. Accompanying with the progress of miniaturization, a dry etching technology and a hard mask material each having high dimensional accuracy have been required. Also, needs for forming deep holes or grooves by dry etching has been heightened in manufacturing a 3-dimensional NAND memory or a capacitor of DRAM (Dynamic Random-Access Memory), etc. Under such a background, a hard mask excellent in etching resistance has been earnestly required.

On the other hand, to prevent a pattern collapse due to shrinkage of the size of a resist pattern, the thickness of the resist film has been thinned, and as a means to prevent the reduction in dry etching resistance due to the film-thinning, a multi-layer resist process has been used. The multi-layer process generally used in this case is a 3-layer (tri-layer) process in which a hydrocarbon film (hydrocarbon under layer film) is formed at a lower layer, an intermediate film containing silicon (silicon-containing intermediate film) is formed thereon, and a resist film is formed thereon. By providing antireflection effects to both of the silicon-containing intermediate film and the hydrocarbon under layer film, high antireflection effect can be obtained. In the age of a liquid immersion lithography in combination with a high NA (Numerical Aperture) lens, incidence angle of light to a substrate becomes shallow, so that reflection of the substrate is increased, and thus, an antireflection film having a high antireflection effect is required. Accordingly, the tri-layer process using a silicon-containing intermediate film and a hydrocarbon under layer film which have excellent antireflection effect was rapidly spread.

For carrying out the lithography for a fine pattern with a narrow focus margin, it is necessary to flatten the base material. In the case that a hydrocarbon under layer film and a silicon-containing intermediate are formed by spin coating, there is a merit that the film surface can be flattened by a simple and easy process only of spin coating and baking, by applying a material excellent in embedding characteristics. However, these films formed by spin coating have a problem of insufficient dry etching resistance for double-patterning or digging deep holes or grooves.

Accordingly, a metal series film excellent in dry etching resistance has been investigated, and a hard mask, such as a silicon film and a titanium nitride film, formed by sputtering or CVD (Chemical Vapor Deposition) has been widely used. However, the hard mask formed by sputtering or CVD cannot flatten unevenness of the base material, so that it is necessary to flatten the film surface by grinding with CMP (Chemical-Mechanical Polishing) after film formation. In addition, sputtering and CVD require special devices, which increase the cost.

As the metal series film, a material for forming a metal oxide film by spin coating has been proposed, and a method in which a metal hard mask is formed under a photoresist film, a carbon film is formed thereunder, and a pattern is formed by tri-layer process is known (Non-Patent Document 1).

In the case of forming the metal oxide film by spin coating, it is necessary to raise the baking temperature after spin coating to 250° C. or higher. At this time, if a usual hydrocarbon film is applied as an under layer film, it is thermally decomposed. Therefore, a hydrocarbon material having high heat resistance is required for the under layer film. As the material, there may be mentioned a novolac resin of fluorene bisnaphthol, and aldehyde condensates of carbazole or fluorenone (see Patent Documents 1 and 2).

In addition, in the tri-layer process, it has been proposed to form a negative pattern by development with an organic solvent. In this case, a margin for subjecting the silicon-containing intermediate film just below the resist to dry etching processing is insufficient since dry etching resistance of the resist film is markedly lowered under the influences both of remaining the film in which the cyclic protective group having etching resistance has been deprotected, and decreasing the film thickness due to the deprotection of the protective group. Thus, it has been investigated to make the silicon-containing intermediate film thin. At present, the film thickness of the silicon-containing intermediate film generally ranges from 30 to 40 nm. This has been determined by the reason that this range enables reflection of a substrate to be minimized, and the balance between the etching rate for transferring the pattern of the resist film and the etching rate for transferring the pattern of the silicon-containing intermediate film to the hydrocarbon film at the lower layer. On the other hand, to deal with insufficiency of dry etching resistance of the resist film, it is necessary to set the thickness of the silicon-containing intermediate film to 10 to 20 nm. However, when the silicon-containing intermediate film is thinned, two problems arise. One is that reflection of the substrate increases, which leads to the reduction in margin of the lithography. The other is that sufficient resistance cannot be secured for processing the hydrocarbon film at the lower layer by dry etching using the pattern of the silicon-containing intermediate film as a mask.

Also, considering the limit of semiconductor miniaturization, an increased capacity without depending on miniaturization is required in memory devices. In a flash memory, it has been investigated to increase the capacity by using a 3-dimensional memory in which memory cells are vertically laminated. In this case, a hole pattern is formed in the film having dozens of layers being laminated, and a gate electrode is embedded therein to form a transistor. In other words, it is required to form a fine hole by development with an organic solvent as mentioned above, and then perform a dry etching using the same to form a deep hole pattern. Accordingly, such processing requires a hard mask that has excellent etching resistance and is capable of transferring a negative pattern having low etching resistance and of deeply processing the laminated film.

As mentioned above, it is desired to develop a multi-layer film that can reduce reflection of the substrate to form a fine pattern and to process a laminated structure, and allows pattern formation with high dimensional accuracy in dry etching.

PRIOR ART DOCUMENTS

Patent Documents

Patent Document 1: Japanese Patent No. 5336306
Patent Document 2: International Patent Laid-Open Publication No. WO 2010/147155
Non-Patent Document 1: Proc. of SPIE Vol. 8682 86820S (2013)

SUMMARY OF THE INVENTION

The present invention has been accomplished in view of the circumstances, and an object thereof is to provide, a method for forming a multi-layer film to be used as a resist under layer film in lithography, in which the method can give a multi-layer film that is capable of reducing reflectance and is useful for a patterning process with high dimensional accuracy in dry etching.

To achieve this object, the present invention provides a method for forming a multi-layer film on a substrate, comprising the steps of:
(1) forming an under layer film on the substrate by applying an under layer film material containing a resin having a repeating unit represented by the general formula (1) or (2) in which a fluorene structure is contained, and curing the same by heat treatment;
(2) forming a metal oxide film on the under layer film by applying a metal oxide film material selected from a titanium oxide film material, a zirconium oxide film material, and a hafnium oxide film material;
(3) forming a hydrocarbon film on the metal oxide film by applying a hydrocarbon film material; and
(4) forming a silicon oxide film on the hydrocarbon film by applying a silicon oxide film material,

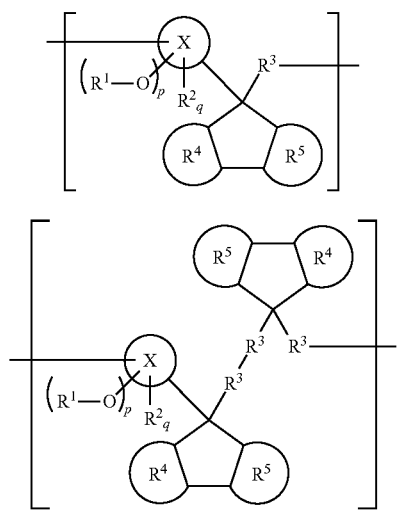

wherein X represents a benzene ring, a naphthalene ring, or a carbazole ring; $R^1$ represents a hydrogen atom, a glycidyl group, a linear, branched, or cyclic alkyl group having 1 to 10 carbon atoms, an aryl group having 6 to 20 carbon atoms, or an alkenyl group having 2 to 20 carbon atoms; $R^2$ represents a hydrogen atom, a linear, branched, or cyclic alkyl group having 1 to 10 carbon atoms, an aryl group having 6 to 10 carbon atoms, or an alkenyl group having 2 to 6 carbon atoms; each $R^3$ independently represents a single bond, an alkylene group having 1 to 20 carbon atoms, an alkenylene group having 2 to 20 carbon atoms, or an arylene group having 6 to 20 carbon atoms, and optionally contains one or more groups selected from an ether group, an ester group, a hydroxyl group, a carboxyl group, an alkoxy group, and a glycidylether group; $R^4$ and $R^5$ independently represent a benzene ring or a naphthalene ring, and a hydrogen atom(s) in the benzene ring or the naphthalene ring may be substituted by a hydrocarbon group having 1 to 6 carbon atoms; and "p" and "q" independently represent an integer of 0 to 2.

When such a method for forming a multi-layer film is employed, a multi-layer film that is capable of reducing reflectance and is useful for a patterning process with high dimensional accuracy in dry etching can be formed.

It is preferred that the heat treatment in the step (1) be carried out at a temperature of 250° C. or higher and 800° C. or lower for 10 seconds to 4,000 seconds.

When such heating temperature is employed, the under layer film material can be efficiently cured, and there is no fear that the resin in the under layer film material is decomposed. In addition, when such heating time is employed, the under layer film material can be efficiently cured, and there is no fear that throughput is lowered.

Further, it is preferred that the heat treatment in the step (1) be carried out at a temperature of 250° C. or higher and 700° C. or lower for 10 seconds to 600 seconds.

Such heating temperature and heating time enable more effective formation of the under layer film.

It is preferred that applying of the materials in the steps (1) to (4) be carried out by a spin coating method.

The spin coating method enables an under layer film, a metal oxide film, a hydrocarbon film, and a silicon oxide film each having a highly flat surface to be formed by a simple and easy process. Also, when all of the films are formed by the spin coating method, the cost can be reduced compared with a method for forming films by sputtering or CVD.

It is preferred that the under layer film having a film thickness of 30 to 20,000 nm be formed in the step (1), the metal oxide film having a film thickness of 3 to 100 nm be formed in the step (2), the hydrocarbon film having a film thickness of 5 to 100 nm be formed in the step (3), and the silicon oxide film having a film thickness of 10 to 20 nm be formed in the step (4).

By making each layer such a film thickness, reflectance can be further reduced, and dimensional accuracy of dry etching can be further enhanced.

Also, the present invention provides a patterning process comprising the steps of:
(A) forming a photoresist film on a multi-layer film which has been formed on a substrate by the above-mentioned method for forming a multi-layer film;
(B) forming a photoresist pattern by subjecting the photoresist film to exposure and development;
(C) transferring the pattern to the silicon oxide film by dry etching using the photoresist pattern as a mask;

(D) transferring the pattern to the hydrocarbon film by dry etching using the silicon oxide film to which the pattern has been transferred as a mask;
(E) transferring the pattern to the metal oxide film by dry etching using the hydrocarbon film to which the pattern has been transferred as a mask; and
(F) transferring the pattern to the under layer film by dry etching using the metal oxide film to which the pattern has been transferred as a mask.

Such a patterning process can reduce reflectance, and can enhance dimensional accuracy of dry etching.

In this case, it is preferred that the dry etching of the step (F) be carried out by using one or more etching gases selected from an oxygen gas, a hydrogen gas, an ammonia gas, a carbon dioxide gas, a carbon monoxide gas, and a sulfur dioxide gas.

By using such etching gases, the pattern can be efficiently transferred to the under layer film by dry etching.

As mentioned above, the method for forming a multi-layer film of the present invention can give a multi-layer film that can be suitably used as a resist under layer film in the lithography, has an optimum n value and k value and embedding characteristics as an antireflection film, and further has excellent etching resistance. In addition, according to the patterning process of the present invention using such a multi-layer film, a pattern may be formed by a 5-layer (penta-layer) process using a photoresist film and a multi-layer film having the above-mentioned characteristics, so that, in particular, even when a negative tone resist pattern developed by an organic solvent which is thin and vulnerable in dry etching resistance is used, the pattern can be transferred with high accuracy.

Further, by using a material having high heat resistance to form the under layer film by the spin coating method, the under layer film can endure a high temperature baking treatment when a metal oxide film (inorganic hard mask) is formed thereon. Thus, a low-cost patterning process combining an under layer film and a metal oxide film (inorganic hard mask) each obtained by the spin coating method can be provided.

DETAILED DESCRIPTION OF THE PREFERRED EMBODIMENTS

As mentioned above, the patterning process using a multi-layer resist film that has a tri-layer structure exhibits more excellent pattern transfer precision than methods using a single layer resist or using an organic antireflection film laid under the resist film, but thinning of the resist film accompanied by the progress of miniaturization and reduction in dry etching resistance of the resist film cause a problem of lowering of pattern transfer precision even when the tri-layer process is employed. Thus, it has been desired to construct a method for forming a multi-layer film that can heighten pattern transfer precision, and a patterning process using the same.

Figure 3A:
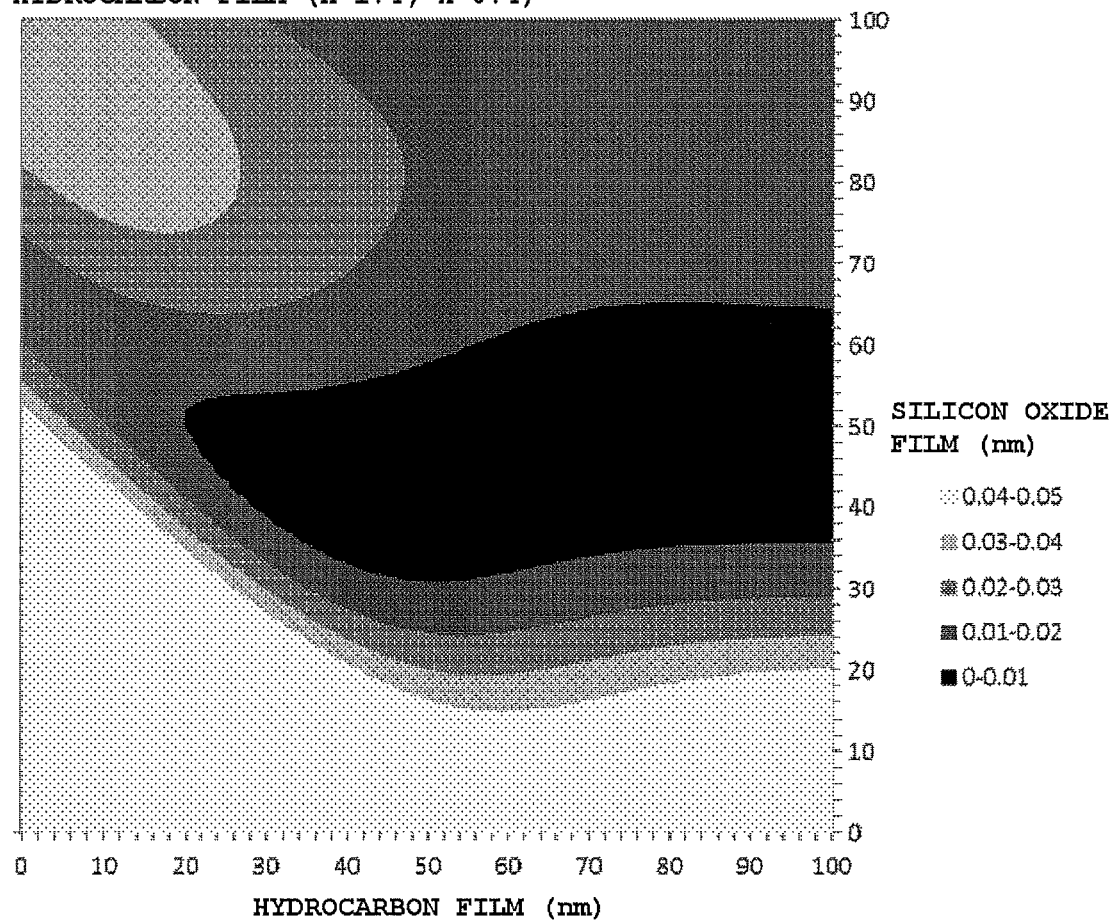
FIG. 3A is a graph showing the reflectance of the substrate when the respective film thicknesses of a silicon oxide film (n value=1.6, k value=0.2) and a hydrocarbon film (n value=1.4, k value=0.4) are changed in the range of 0 to 100 nm at a wavelength of 193 nm, NA=1.35, using dipole illumination in the 3-layer process.

FIG. 3A shows reflectance of a silicon substrate for tri-layer process that has a resist film, a silicon oxide film (n value=1.6, k value=0.2) placed under the resist film, and a hydrocarbon film (n value=1.4, k value=0.4) placed under the silicon oxide film, when film thickness of the hydrocarbon film and the silicon oxide film are changed. At this time, liquid immersion lithography with a wavelength of 193 nm and dipole illumination of NA=1.35 as an optical illumination is employed. Also, gradations in the graph show that denser the color is, the lower the reflectance of the substrate is. From FIG. 3A, it can be understood that, in the case of tri-layer process, if the film thickness of the silicon oxide film is in the range of 35 to 60 nm, there exist a black region where the reflectance is 1% or less regardless of the film thickness of the hydrocarbon film, whereas if the silicon oxide film is set to 35 nm or less, reflection of the substrate increases. From these results, it can be understood that reduction of the reflectance and film-thinning of the silicon oxide film cannot be achieved simultaneously in the tri-layer process.

In the case of a tri-layer composed of a resist film, a silicon oxide film, and a hydrocarbon film, it is necessary to make reflection of the substrate constant by filling unevenness of the substrate even when the film thickness of the hydrocarbon film is changed. Therefore, a thick layer region at which reflection of the substrate is constant even when the film thickness of the hydrocarbon film is changed is used, and further, a material having high absorption, i.e., having a large k value is selected so that reflection of the substrate becomes constant. From the viewpoint of suppressing reflection alone, the optimum k value of the hydrocarbon film is 0.2 to 0.3, but according to this value, absorption is not sufficient, and reflection of the substrate increases or decreases depending on the effect of fluctuations in film thickness of the hydrocarbon film. For the above reasons, a material having a k value of 0.4 or more is used for the tri-layer process. However, in this case, if the film thickness of the silicon oxide film is thinned to 20 nm or less, the problem occurs that reflection increases.

Also, a resist pattern obtained by negative development has extremely low etching resistance under the influences of thinning the resist film thickness accompanied by the progress of miniaturization, and shrink of the film thickness due to deprotection of a cyclic protective group that improves etching resistance. It has been investigated to make the silicon oxide film just below the resist film thin to transfer the resist pattern having extremely low etching resistance. However, in the case of the tri-layer process, a thinned silicon oxide film causes the increase in reflection of the substrate as mentioned above, so that there is a problem that a margin of lithography is lowered.

To solve these problems, the present inventors have focused an attention on pattern formation by a penta-layer process.

Figure 3B:
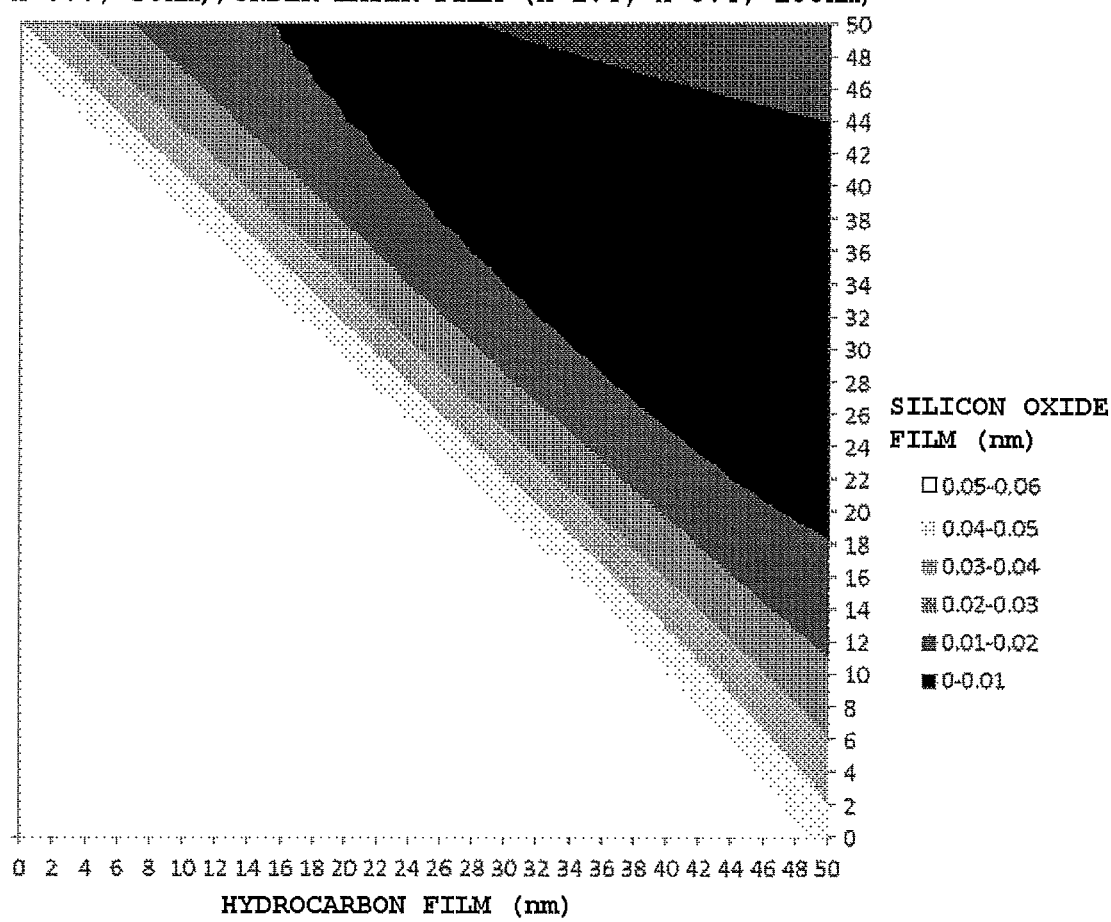
FIG. 3B is a graph showing the reflectance of the substrate when an under layer film (n value=1.4, k value=0.4; film thickness: 100 nm) and a titanium oxide film (n value=1.6, k value=0.7; film thickness 30 nm) are used, and the respective film thicknesses of a silicon oxide film (n value=1.6, k value=0.2) and a hydrocarbon film (n value=1.5, k value=0.3) are changed in the range of 0 to 50 nm at a wavelength of 193 nm, NA=1.35, using dipole illumination in the 5-layer process.

FIG. 3B shows reflectance of a silicon substrate for penta-layer process that has a resist film, a silicon oxide film (n value=1.6, k value=0.2) placed under the resist film, a hydrocarbon film (n value=1.5 and k value=0.3) placed under the silicon oxide film, a titanium oxide film (n value=1.6, k value=0.7; film thickness 30 nm) placed under the hydrocarbon film, and an under layer film (n value=1.4, k value=0.4; film thickness: 100 nm) placed under the titanium oxide film, when film thicknesses of the hydrocarbon film and the silicon oxide film are changed. The titanium oxide film has an extremely large absorption at a wavelength of 193 nm, and exhibits high reflectance, as well as a zirconium oxide film, and a hafnium oxide. From FIG. 3B, it can be understood that, in the case of the penta-layer process, there exist a region which gives reflection of the substrate of 1% or less even when the film thickness of the silicon oxide film is thinned to about 20 nm. From these results, it can be understood that both of reduction of the reflectance and film-thinning of the silicon oxide film can be achieved simultaneously in the penta-layer process.

Figure 3C:
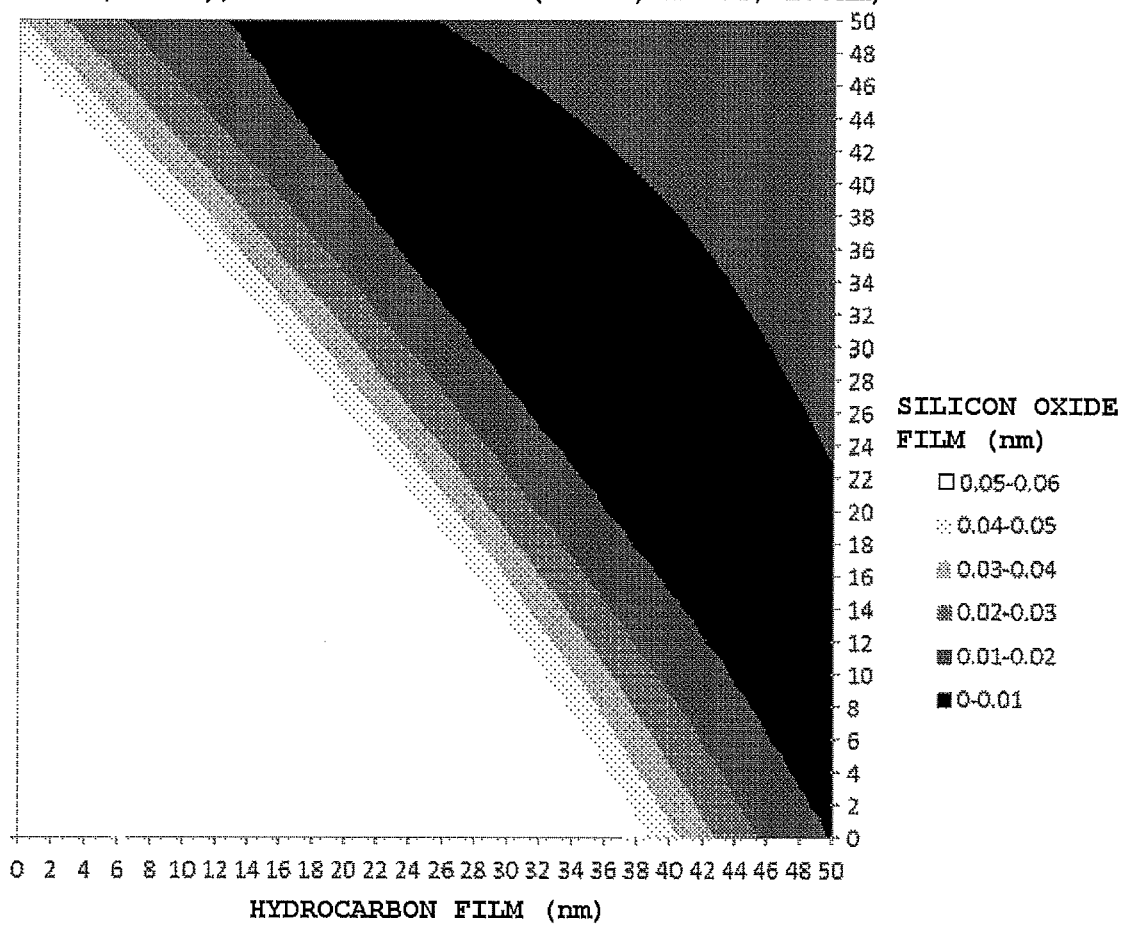
FIG. 3C is a graph showing the reflectance of the substrate when an under layer film (n value=1.4, k value=0.4; film thickness 100 nm) and a titanium oxide film (n value=1.6, k value=0.7; film thickness 30 nm) are used, and the respective film thicknesses of a silicon oxide film (n value=1.6, k value=0.2) and a hydrocarbon film (n value=1.6, k value=0.3) are changed in the range of 0 to 50 nm at a wavelength of 193 nm, NA=1.35, using dipole illumination in the 5-layer process.
Figure 3D:
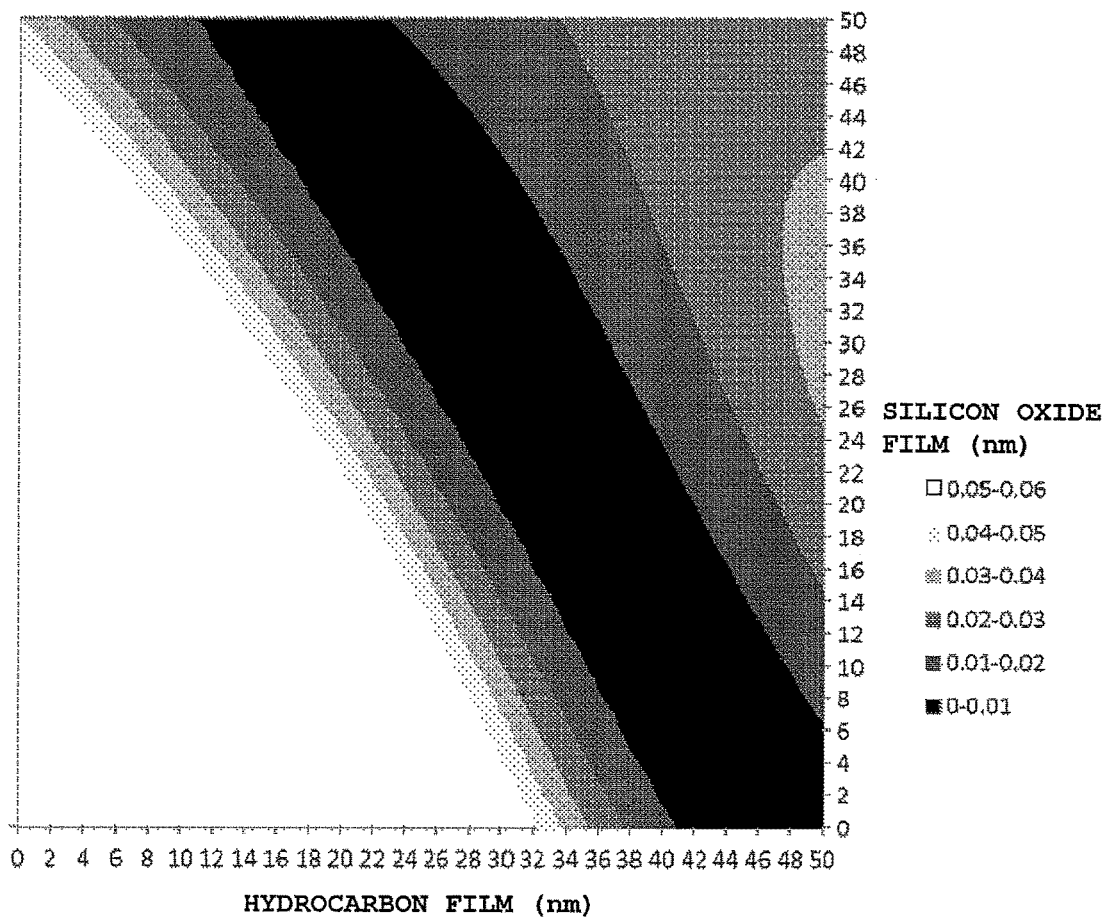
FIG. 3D is a graph showing the reflectance of the substrate when an under layer film (n value=1.4, k value=0.4; film thickness 100 nm) and a titanium oxide film (n value=1.6, k value=0.7; film thickness 30 nm) are used, and the respective film thicknesses of a silicon oxide film (n value=1.6, k value=0.2) and a hydrocarbon film (n value=1.7, k value=0.3) are changed in the range of 0 to 50 nm at a wavelength of 193 nm, NA=1.35, using dipole illumination in the 5-layer process.

Further, FIG. 3C shows reflectance of the above-mentioned substrate for penta-layer process in which the n value of the hydrocarbon film is heightened (n value=1.6, k value=0.3), and FIG. 3D shows reflectance of the above-mentioned substrate for penta-layer process in which the n value of the hydrocarbon film is further heightened (n value=1.7, k value=0.3). From FIGS. 3C and 3D, it can be understood that if the n value of the hydrocarbon film is heightened in the penta-layer process, a region which can suppress reflection of the substrate even when the silicon oxide film is thinned to 20 nm or less is broadened to the thin layer side of the hydrocarbon film.

From the above facts, the present inventors have found that, when embedding and flattening of the substrate is carried out by an under layer film, and then a metal oxide film selected from a titanium oxide film, a zirconium oxide film, and a hafnium oxide film is formed thereon, light is totally reflected on the metal oxide film, but an antireflection film (a hydrocarbon film and a silicon oxide film) applied thereon does not change the reflectance even when the film thickness is changed because the base material has already been flattened, so that a film thickness that gives the exactly minimum reflection can be selected. Also, they have found that selecting a hydrocarbon film material having a high n value allows thinning of the film thickness of the silicon oxide film.

Besides, in the conventional patterning process by the tri-layer process, when an amorphous carbon film is formed at a lower layer, and a hard mask that also functions as an antireflection film, such as SiON, is formed thereon, the SiON hard mask shows excellent etching resistance to the amorphous carbon formed at the lower layer, and the amorphous carbon film also shows excellent dry etching resistance to the substrate to be processed that is positioned thereunder. This is a firm combination in view of dry etching resistance. The formation of the amorphous carbon film is generally performed by CVD method, however, unevenness of the substrate used as a substrate to be processed cannot be flattened by the CVD method, so that it is necessary to plane the surface of the amorphous carbon film by the CMP method to flatten the substrate surface. That is, there arises the problem that the processing cost is increased by applying the CMP process.

On the other hand, for forming a flat carbon film surface, spin coating is effective. In this case, a carbon film having a flat surface can be formed by the simple and easy process of applying and baking, so that throughput thereof is high and the cost is low. That is, in the present invention, it is effective to form an under layer film by spin coating for embedding and flattening of the substrate by the under layer film.

Further, as mentioned above, the metal oxide film is formed on the under layer film by applying a material by the spin coating method or the like, and raising the substrate temperature to 250° C. or higher (baking) after spin coating, whereby a firm metal oxide film is formed. Accordingly, the coating type under layer film that is used as a base material of the metal oxide film in the present invention requires high heat resistance of 250° C. or higher. The present inventors have conceived to use a resin that has a repeating unit containing a specific fluorene structure as the under layer film material having such a high heat resistance, thereby brought the present invention completion.

That is, the present invention is a method for forming a multi-layer film on a substrate, comprising the steps of:

(1) forming an under layer film on the substrate by applying an under layer film material containing a resin having a repeating unit represented by the general formula (1) or (2) in which a fluorene structure is contained, and curing the same by heat treatment;

(2) forming a metal oxide film on the under layer film by applying a metal oxide film material selected from a titanium oxide film material, a zirconium oxide film material, and a hafnium oxide film material;

(3) forming a hydrocarbon film on the metal oxide film by applying a hydrocarbon film material; and (4) forming a silicon oxide film on the hydrocarbon film by applying a silicon oxide film material,

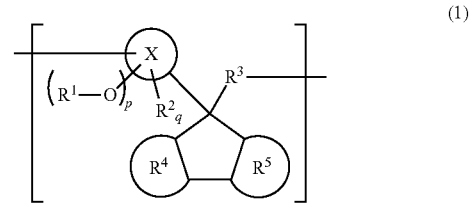

(1)

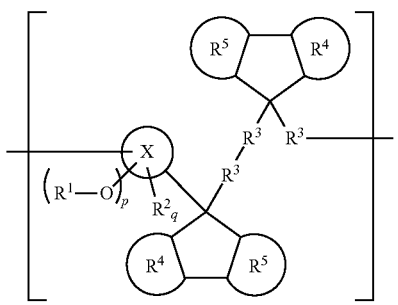

(2)

wherein X represents a benzene ring, a naphthalene ring, or a carbazole ring; R¹ represents a hydrogen atom, a glycidyl group, a linear, branched, or cyclic alkyl group having 1 to 10 carbon atoms, an aryl group having 6 to 20 carbon atoms, or an alkenyl group having 2 to 20 carbon atoms; R² represents a hydrogen atom, a linear, branched, or cyclic alkyl group having 1 to 10 carbon atoms, an aryl group having 6 to 10 carbon atoms, or an alkenyl group having 2 to 6 carbon atoms; each R³ independently represents a single bond, an alkylene group having 1 to 20 carbon atoms, an alkenylene group having 2 to 20 carbon atoms, or an arylene group having 6 to 20 carbon atoms, and optionally contains one or more groups selected from an ether group, an ester group, a hydroxyl group, a carboxyl group, an alkoxy group, and a glycidylether group; R⁴ and R⁵ independently represent a benzene ring or a naphthalene ring, and a hydrogen atom(s) in the benzene ring or the naphthalene ring may be substituted by a hydrocarbon group having 1 to 6 carbon atoms; and "p" and "q" independently represent an integer of 0 to 2.

Hereinafter, the method for forming a multi-layer film of the present invention will be explained in detail, but the present invention is not limited thereto.

<Method for Forming a Multi-Layer Film>

Figure 1:
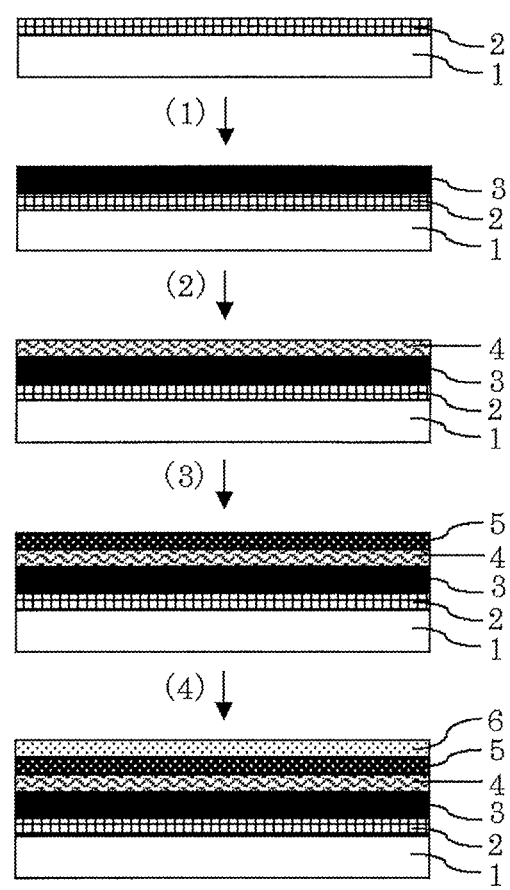
FIG. 1 is a flow chart showing an example of the method for forming a multi-layer film of the present invention.

FIG. 1 is a flow chart showing an example of the method for forming a multi-layer film of the present invention. The method for forming a multi-layer film in FIG. 1, (1) an under layer film material is applied onto a layer to be processed 2 which has been formed on a substrate 1, and cured by heat treatment to form an under layer film 3, (2) a metal oxide film material is applied onto the under layer film 3 to form a metal oxide film 4, (3) a hydrocarbon film material is applied onto the metal oxide film 4 to form a hydrocarbon film 5, and (4) a silicon oxide film material is applied onto the hydrocarbon film 5 to form a silicon oxide film 6, whereby a multi-layer film is formed onto the substrate 1 (the layer to be processed 2).

Hereinafter, each step of the method for forming a multi-layer film of the present invention is explained in more detail.

[Step (1)]

In the step (1) of the method for forming a multi-layer film of the present invention, an under layer film material containing a resin having a repeating unit represented by the general formula (1) or (2) in which a fluorene structure is contained is applied onto a substrate, and cured by heat treatment to form a under layer film.

(Substrate (Substrate to be Processed))

As the substrate (the substrate to be processed) to be used in the method for forming a multi-layer film of the present invention, a substrate on which a layer to be processed is formed is preferably used. The substrate is not particularly limited, and a material comprising Si, α-Si, p-Si, SiO₂, SiN, SiON, W, TiN, Al, etc., and a material different from that of the layer to be processed is suitably used. As the layer to be processed, various kinds of low-k films such as Si, SiO₂, SiON, SiN, p-Si, α-Si, W, W—Si, Al, Cu, Al—Si, etc., and its stopper film are suitably used. The layer may be generally formed with a thickness of 50 to 10,000 nm, in particular, 100 to 5,000 nm.

(Under Layer Film)

The under layer film material to be used in the method for forming a multi-layer film of the present invention contains a resin that has a repeating unit containing a fluorene structure as represented by the general formula (1) or (2). By containing such a resin that has a repeating unit containing a fluorene structure, an under layer film excellent in heat resistance and etching resistance can be formed.

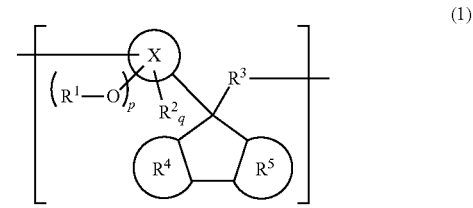

(1)

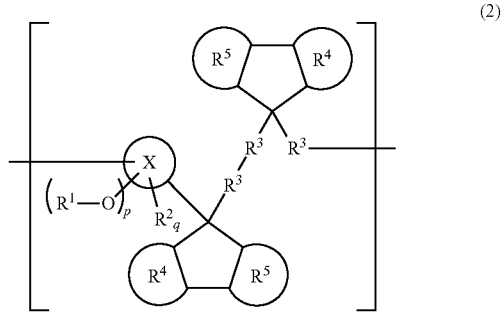

(2)

wherein X represents a benzene ring, a naphthalene ring, or a carbazole ring; R¹ represents a hydrogen atom, a glycidyl group, a linear, branched, or cyclic alkyl group having 1 to 10 carbon atoms, an aryl group having 6 to 20 carbon atoms, or an alkenyl group having 2 to 20 carbon atoms; R² represents a hydrogen atom, a linear, branched, or cyclic alkyl group having 1 to 10 carbon atoms, an aryl group having 6 to 10 carbon atoms, or an alkenyl group having 2 to 6 carbon atoms; each R³ independently represents a single bond, an alkylene group having 1 to 20 carbon atoms, an alkenylene group having 2 to 20 carbon atoms, or an arylene group having 6 to 20 carbon atoms, and optionally contains one or more groups selected from an ether group, an ester group, a hydroxyl group, a carboxyl group, an alkoxy group, and a glycidylether group; R⁴ and R⁵ independently represent a benzene ring or a naphthalene ring, and a hydrogen atom(s) in the benzene ring or the naphthalene ring may be substituted by a hydrocarbon group having 1 to 6 carbon atoms; and "p" and "q" independently represent an integer of 0 to 2.

The under layer film material contains:
(i) the resin having a repeating unit represented by the general formula (1) or (2) in which a fluorene structure is contained, as an essential component, and generally contains
(ii) an organic solvent, and may further contain
(iii) a monomer or a polymer for blend (polymer other than the resin of (i)), (iv) a crosslinking agent, (v) an acid generator, etc., if necessary, for improving spin coating characteristics, embedding characteristics to a stepped substrate, and rigidity or solvent resistance of the film.

The resin that has a repeating unit represented by the general formula (1) or (2) contains a fluorene structure such as fluorene phenol, fluorene naphthol, and fluorene carbazole in the repeating unit. Preferable examples thereof include a resin that has a repeating unit containing a structure such as fluorene bisphenol and fluorene bisnaphthol, in particular, a novolac structure obtained by reacting a fluorene bisphenol compound or a fluorene bisnaphthol compound in the presence of aldehydes. Alternatively, the repeating unit may contains a structure having two fluorene as shown by the general formula (2).

The repeating unit represented by the general formula (1) or (2) in which a fluorene structure is contained may be exemplified by the following.

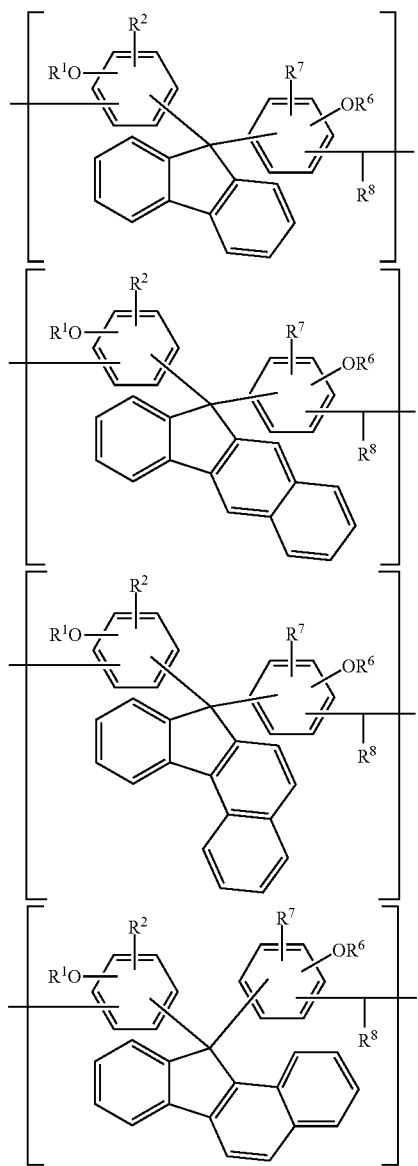

-continued

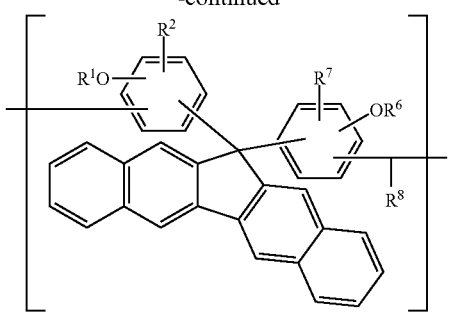

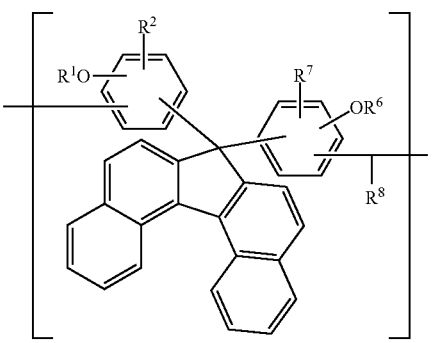

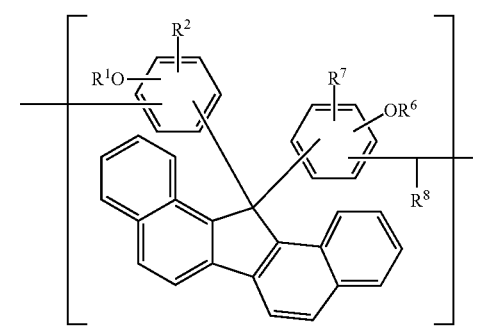

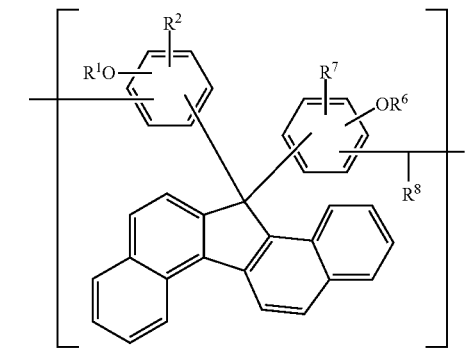

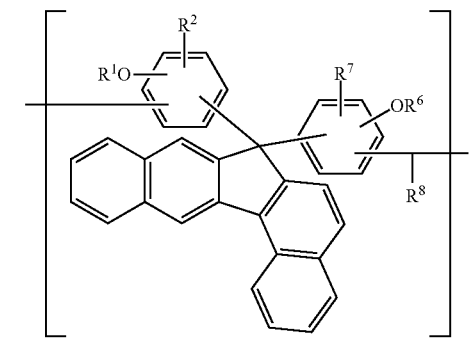

-continued
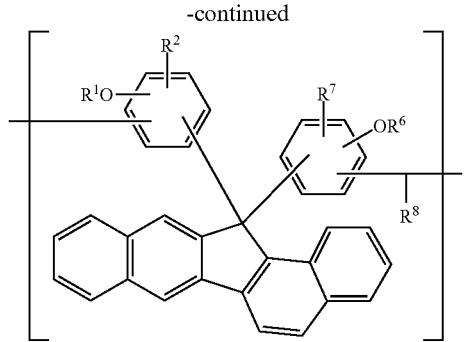
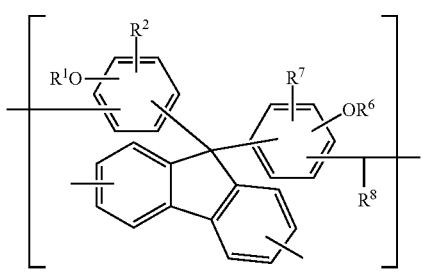
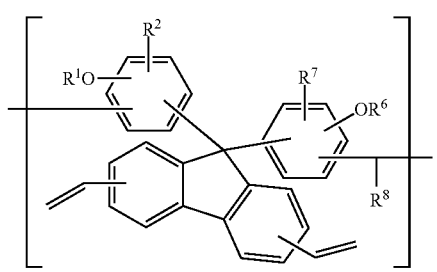
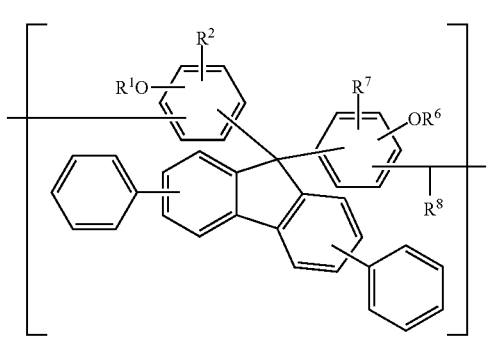
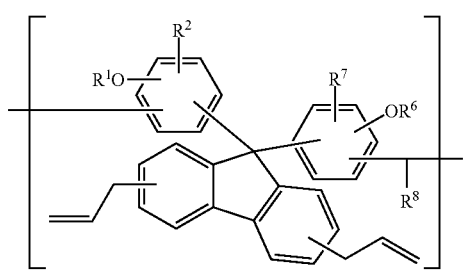
-continued
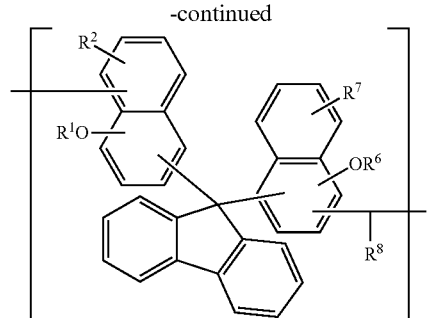
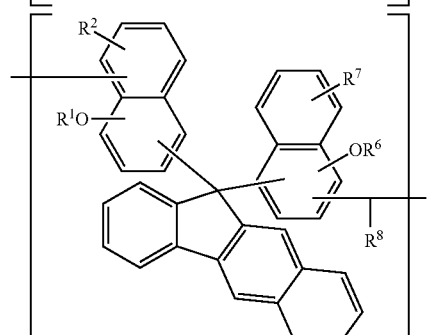
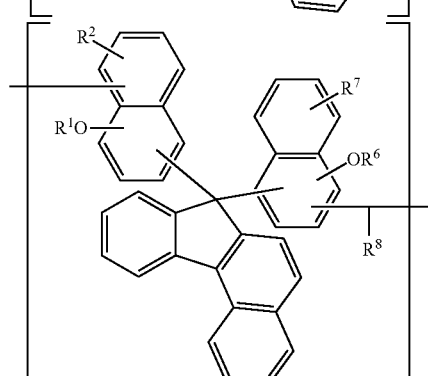
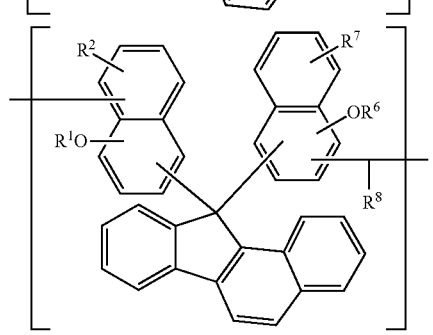
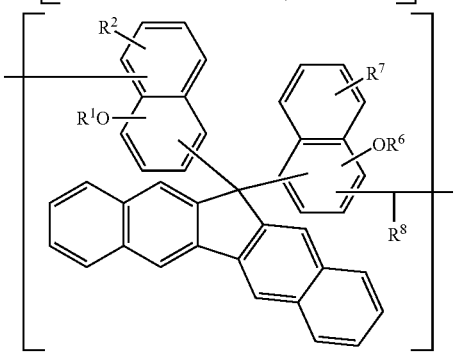

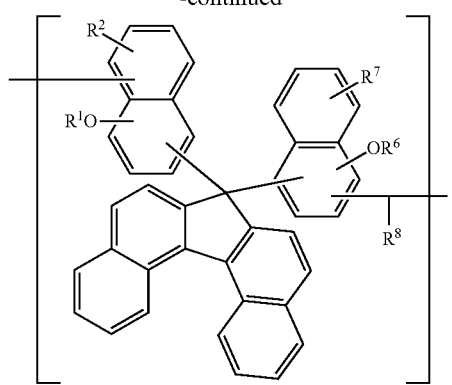
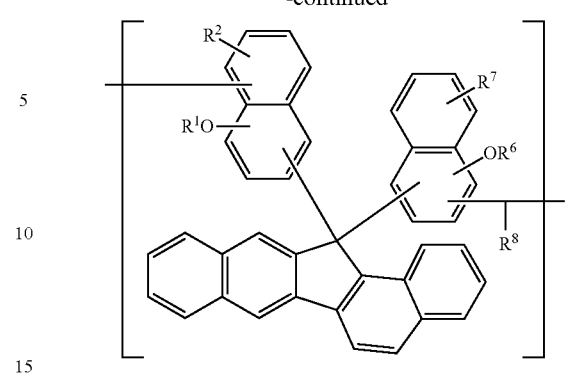
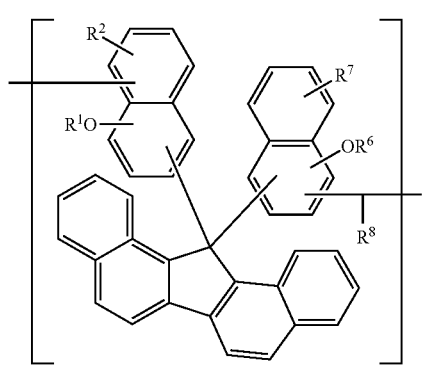
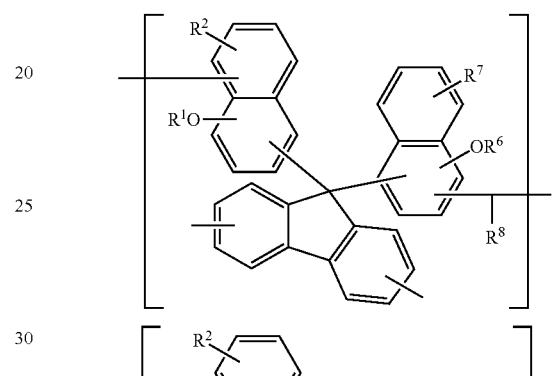
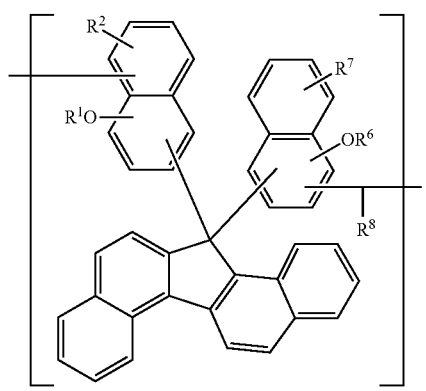
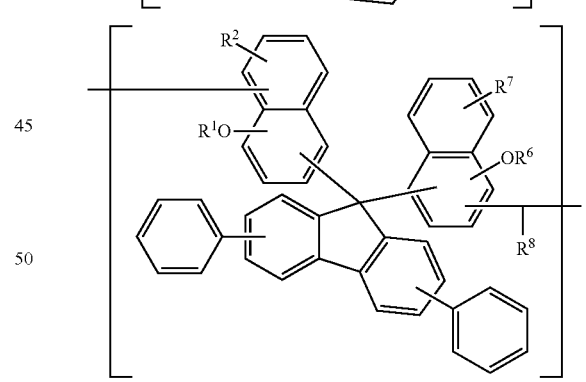
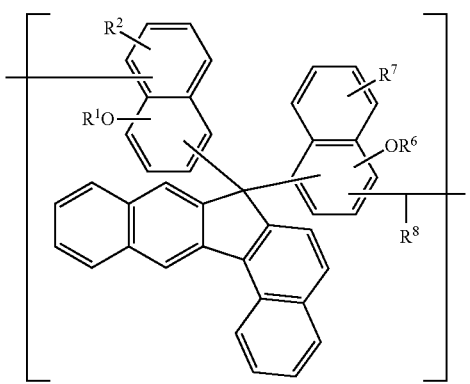
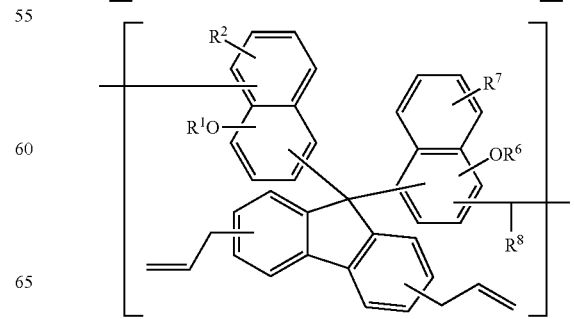

-continued

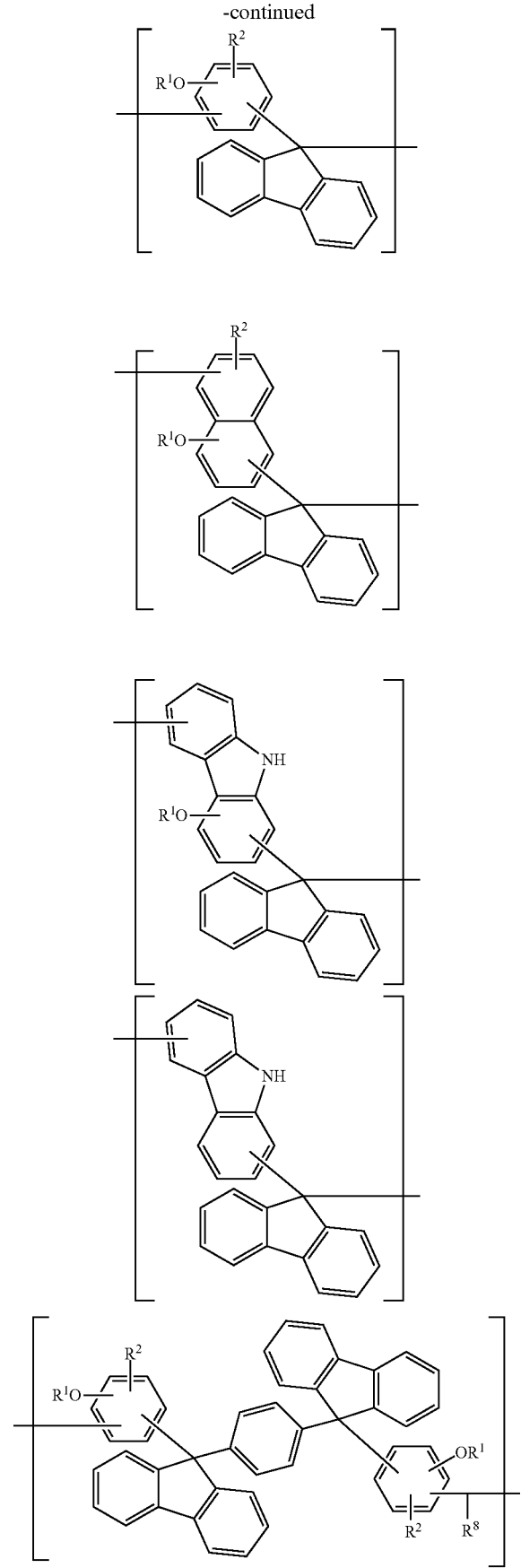

-continued

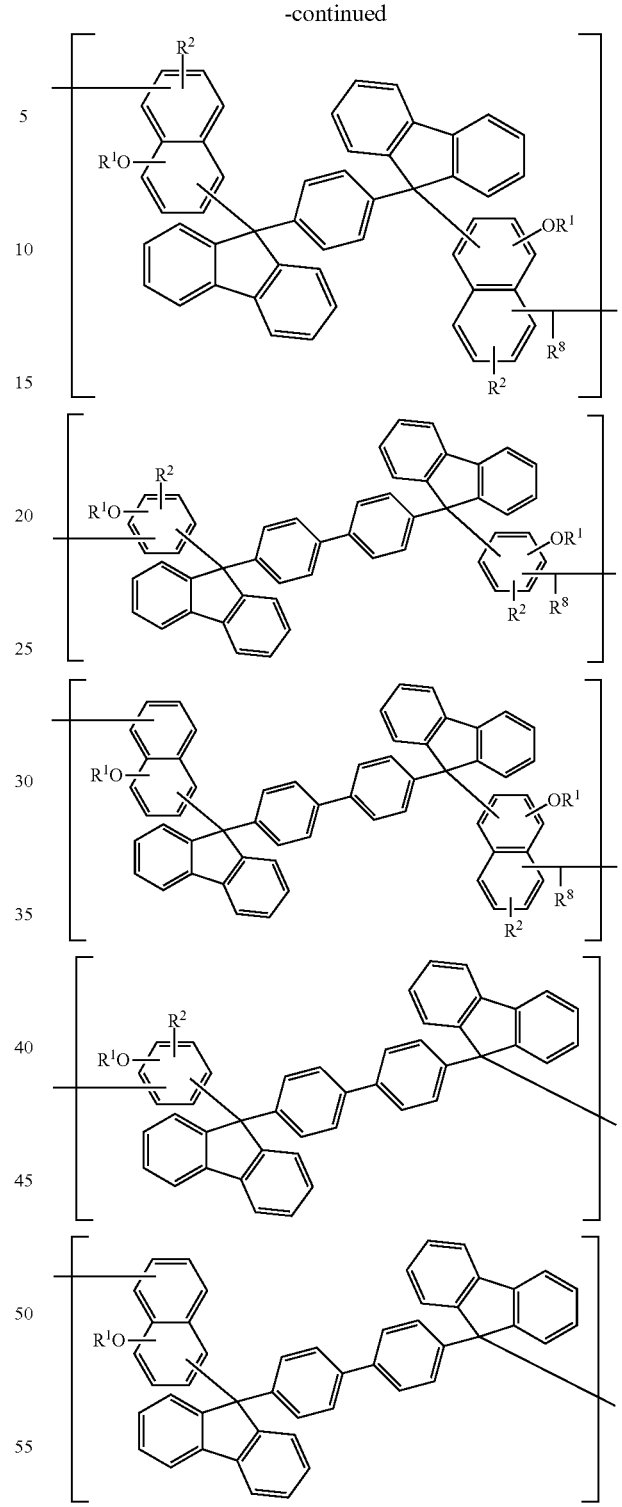

wherein $R^1$ and $R^2$ have the same meanings as defined above; $R^6$ is the same as $R^1$; $R^7$ is the same as $R^2$; and $R^8$ represents a hydrogen atom, an alkyl group having 1 to 10 carbon atoms, an alkenyl group having 2 to 10 carbon atoms, or an aryl group having 6 to 10 carbon atoms, and these groups may contain one or more groups selected from a hydroxyl group, a carboxyl group, an ester group, an ether group, and a lactone ring.

In addition to the resin having the repeating unit mentioned above, a compound (monomer) having the following fluorene structure may be added.
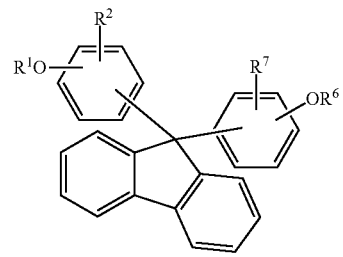
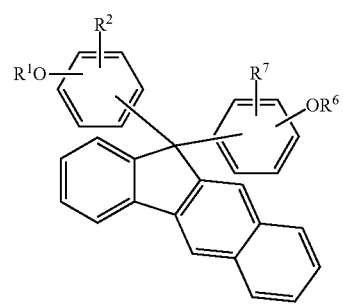
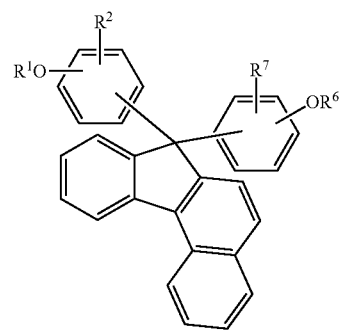
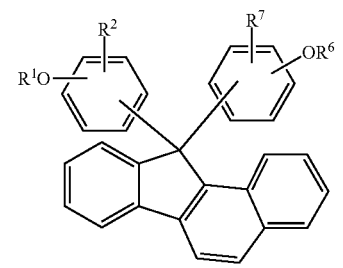
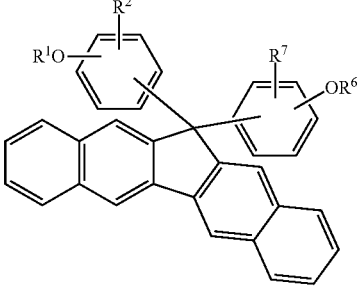
-continued
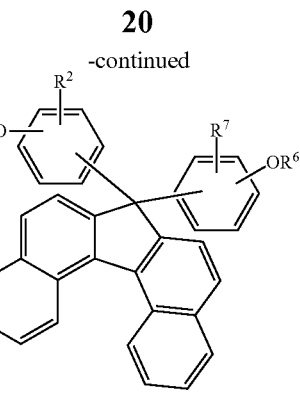
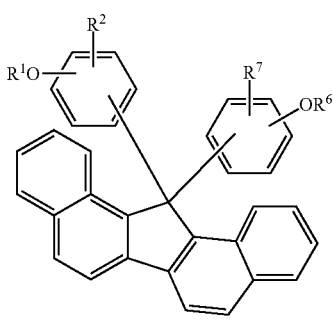
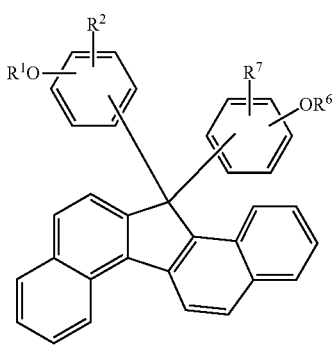
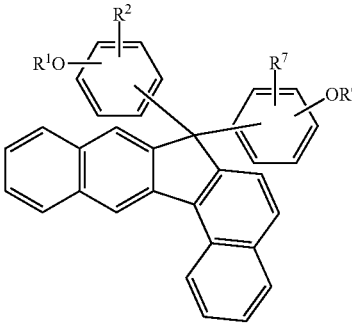
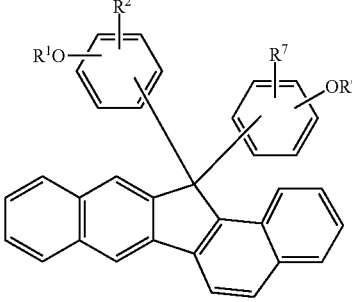

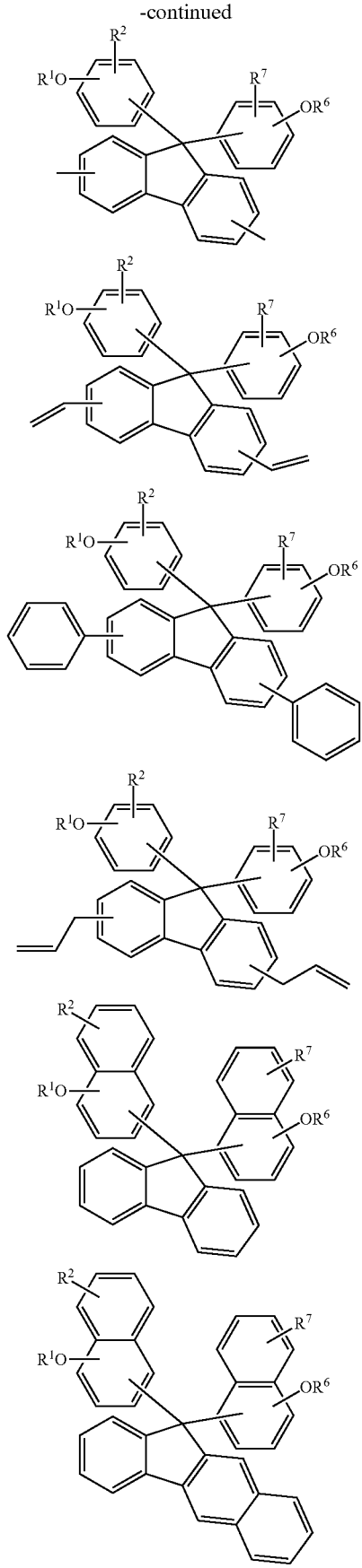
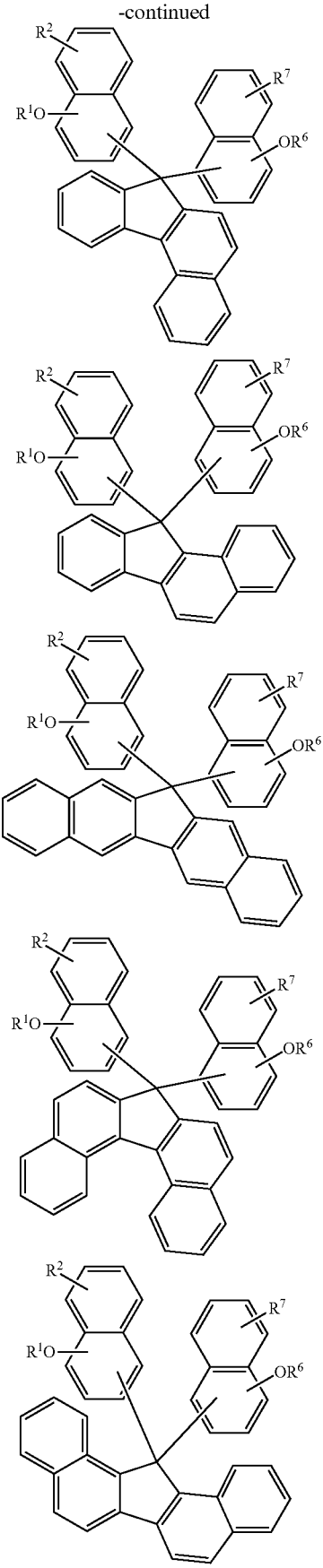

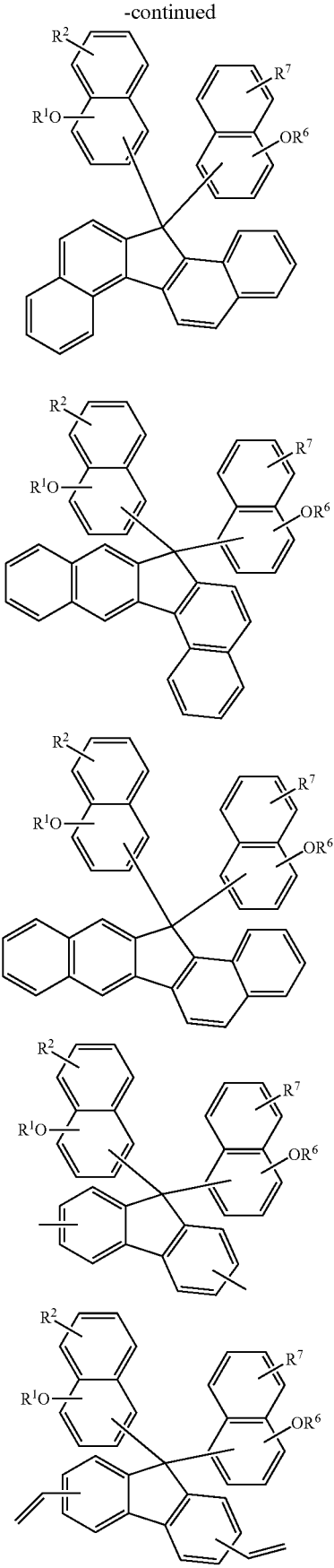
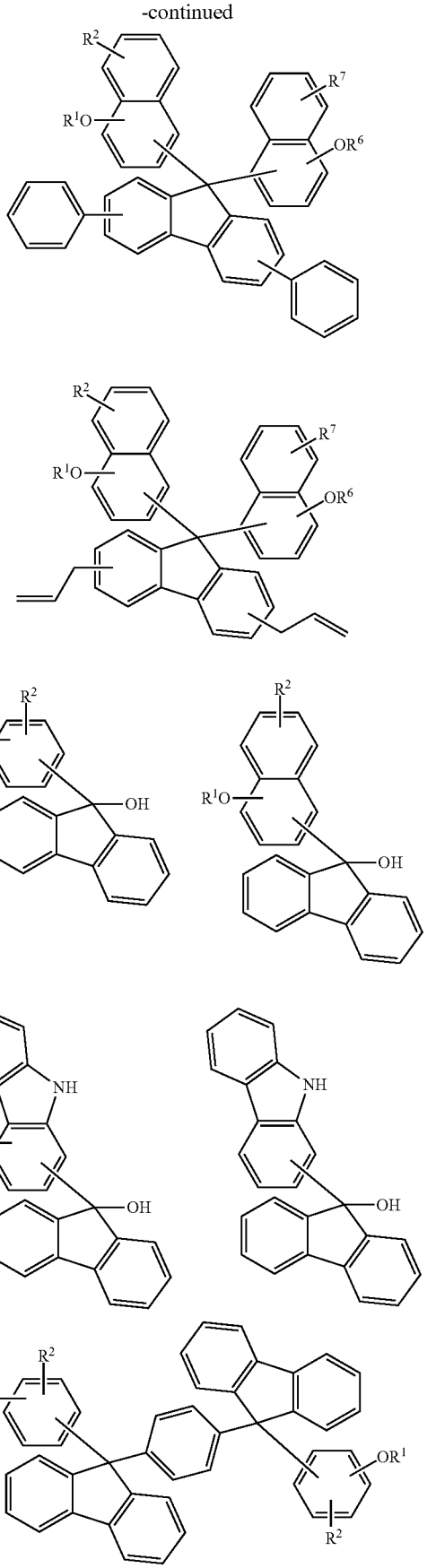

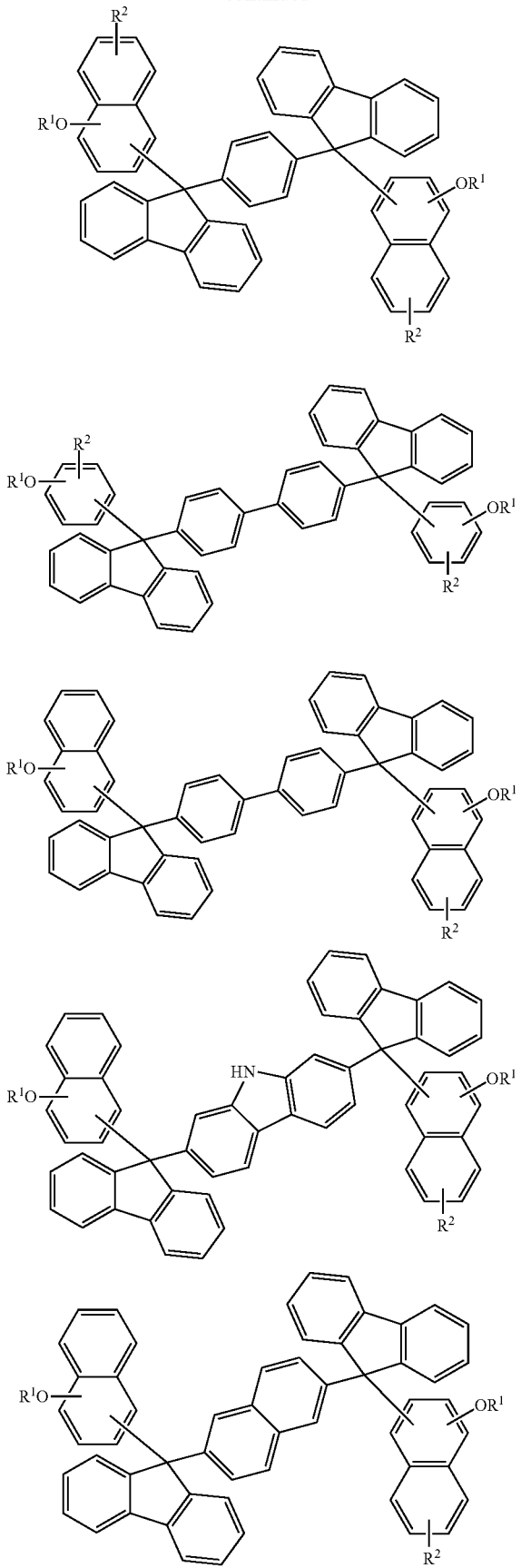

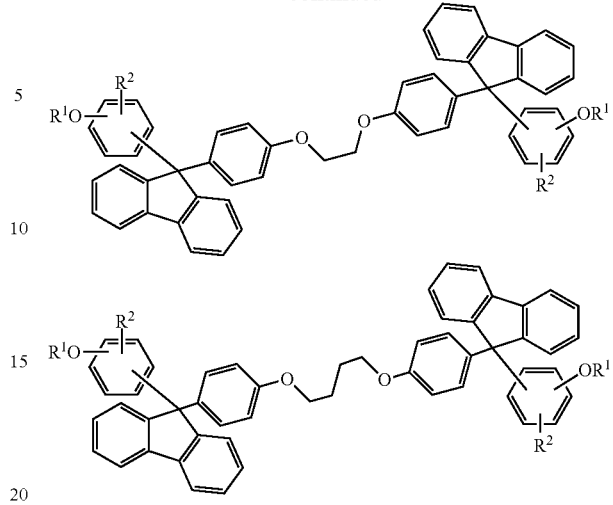

wherein $R^1$, $R^2$, $R^6$, and $R^7$ have the same meanings as defined above.

The structure such as fluorene bisphenol and fluorene bisnaphthol has a cardo structure of a quaternary carbon, whereby it has extremely high heat resistance. When an inorganic hard mask intermediate film (metal oxide film) is to be formed on the under layer film, a high temperature of at least 250° C. or higher, preferably 300° C. or higher, more preferably 350° C. or higher is necessary for baking after spin coating, so that the under layer film is also required to have high heat resistance. In particular, fluorene bisnaphthol has a relatively small absorption at a wavelength of 193 nm due to absorption shift to a longer wavelength side by the naphthalene, so that it can be expected to have good anti-reflection effect when it is used in the multi-layer process.

Among the above, fluorene bisphenol compounds and fluorene bisnaphthol compounds in which $R^1$ and $R^6$ are hydrogen atoms can be obtained by reacting a phenol or a naphthol with a corresponding fluorenone according to the usual manner, and fluorene bisphenol compounds and fluorene bisnaphthol compounds in which $R^1$ and $R^6$ are glycidyl groups can be obtained by glycidylating the hydroxyl group of the phenol compound or the naphthol compound obtained by the above method according to the usual manner.

As mentioned above, a resin that has a repeating unit containing a novolac structure obtained by reacting a compound having a fluorene structure such as a fluorene bisphenol compound and a fluorene bisnaphthol compound in the presence of aldehydes can be suitably used for the under layer film material to be used in the method for forming a multi-layer film of the present invention. Examples of the aldehydes used in this reaction include formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenz-aldehyde, m-nitrobenzaldehyde, p-nitrobenzaldehyde, o-methylbenzaldehyde, m-methylbenzaldehyde, p-methylbenz-aldehyde, p-ethylbenzaldehyde, p-n-butylbenzaldehyde, 1-naphthaldehyde, 2-naphthaldehyde, and furfural.

Among these, formaldehyde is particularly suitably used. In addition, these aldehydes may be used alone or in combination of two or more kinds. The amount of the aldehydes to be used is preferably 0.2 to 5 mol, more preferably 0.5 to 2 mol per 1 mol of the compound having a fluorene structure.

A catalyst may be used in the condensation reaction of the compound having a fluorene structure with aldehyde. Illustrative examples of the catalyst include acidic catalysts such as hydrochloric acid, nitric acid, sulfuric acid, formic acid, oxalic acid, acetic acid, methanesulfonic acid, camphor sulfonic acid, tosic acid, and trifluoromethanesulfonic acid. The amount of the acidic catalyst to be used is $1 \times 10^{-5}$ to $5 \times 10^{-1}$ mol per 1 mol of the compound having a fluorene structure. In the case of the copolymerization reaction with a compound having a non-conjugated double bond(s) such as styrene, hydroxystyrene, vinylnaphthalene, hydroxyvinylnaphthalene, carbazole, vinylcarbazole, vinylanthrathene, indene, hydroxyindene, benzofuran, hydroxyanthrathene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, limonene, etc., the aldehydes are not necessarily required.

Preferable examples of a reaction solvent used in the polycondensation include water, methanol, ethanol, propanol, butanol, tetrahydrofuran, dioxane, and a mixed solvent thereof. These solvents are preferably used in the range of 0 to 2,000 parts by mass based on 100 parts by mass of the starting materials for the reaction.

The reaction temperature may be appropriately selected depending on the reactivities of starting materials for the reaction, and generally in the range of 10 to 200° C.

As the method of polycondensation, there may be mentioned a method in which the compound having a fluorene structure, the aldehydes, and the catalyst are charged at once; and a method in which the compound having a fluorene structure and the aldehydes are added dropwise in the presence of the catalyst. After completion of the polycondensation reaction, volatile components can be removed by raising the temperature inside the reaction vessel to 130 to 230° C. and reducing the pressure to about 1 to 50 mmHg for the purpose of removing unreacted starting materials, the catalyst, and so forth, existing in the reaction system.

The compound (monomer) having a fluorene structure for obtaining the resin having a fluorene structure represented by the general formula (1) or (2) may be polymerized alone, or may be copolymerized with other phenols. Illustrative examples of the copolymerizable phenols include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, and isothymol.

Illustrative examples of the other copolymerizable monomer include 1-naphthol, 2-naphthol, 2-methyl-1-naphthol, 4-methoxy-1-naphthol, 7-methoxy-2-naphthol, dihydroxynaphthalenes such as 1,5-dihydroxynaphthalene, 1,7-dihydroxynaphthalene, and 2,6-dihydroxynaphthalene, methyl 3-hydroxy-naphthalene-2-carboxylate, 4-tritylphenol, indene, hydroxyindene, benzofuran, hydroxyanthrathene, dihydroxyanthrathene, trihydroxyanthrathene, hydroxypyrene, acenaphthylene, biphenyl, bisphenol, trisphenol, xylene, dicyclopentadiene, tetrahydroindene, 4-vinylcyclohexene, norbornadiene, 5-vinylnorborna-2-ene, α-pinene, β-pinene, and limonene. The resin may be a copolymer of ternary or more adding these components.

It is also possible to co-condense with aromatic compounds substituted by a hydroxymethyl group, an alkoxymethyl group, a halomethyl group, or other group, by reacting aromatic compounds with aldehydes. Illustrative examples of the aromatic compounds substituted by an alcohol such as a hydroxymethyl group include benzene-dimethanol, benzenetrimethanol, toluenedimethanol, ethylbenzenedimethanol, propylbenzenedimethanol, butylbenzenedimethanol, cyclohexylbenzenedimethanol, xylenedimethanol, mesitylenedimethanol, naphthalene-dimethanol, naphthalenetrimethanol, methylnaphthalene-dimethanol, ethylnaphthalenedimethanol, propylnaphthalene-dimethanol, butylnaphthalenedimethanol, dimethylnaphthalenedimethanol, anthracenedimethanol, phenanthrenedimethanol, pyrenedimethanol, pentacene-dimethanol, fluorenedimethanol, biphenyldimethanol, bisnaphthalenedimethanol, fluoranthenedimethanol, indenedimethanol, acenaphthylenedimethanol, acephenanthrylenedimethanol, and aceanthrylenedimethanol. The aromatic compounds substituted by an alkoxymethyl group are compounds in which the hydroxymethyl group of the above-mentioned compounds is substituted by an alkoxymethyl group, and the aromatic compounds substituted by a halomethyl group are compounds in which the hydroxymethyl group of the above-mentioned compounds is substituted by a halomethyl group. In this case, the aldehyde is not necessarily required in the co-condensation reaction.

The molecular weight of the resin containing a fluorene structure represented by the general formula (1) or (2) in terms of polystyrene is preferably a weight average molecular weight (Mw) of 1,000 to 30,000, particularly preferably 2,000 to 20,000. The molecular weight distribution thereof is preferably in the range of 1.2 to 7, and those in which a monomer component, an oligomer component, or a low molecular weight component having a molecular weight (Mw) of 1,000 or less has cut to narrow the molecular weight distribution are preferred since crosslinking efficiency becomes high, and volatile components during baking is suppressed whereby contamination in the vicinity of the baking cup can be prevented.

The resin containing a fluorene structure represented by the general formula (1) or (2) may be blended with other polymer. The polymer for blend preferably serves to improve film-formability in spin coating or embedding characteristics of the stepped substrate by mixing the polymer with the resin containing a fluorene structure represented by the general formula (1) or (2). More specifically, a polymer capable of reducing the softening point, such as polyethylene glycol, polypropyrene glycol, polyacrylate, polymethacrylate, polyacetal, and polyvinyl ether, is suitable.

In addition, a material having high carbon density and having high etching resistance may be blended. As examples of the material, there may be mentioned the same materials as exemplified for the hydrocarbon film material as described later.

The formulation amount of the polymer for blend may be 0 to 1,000 parts by mass, preferably 0 to 500 parts by mass based on 100 parts by mass of the resin containing a fluorene structure represented by the general formula (1) or (2).

Also, to the under layer film material to be used in the method for forming a multi-layer film of the present invention, a monomer component to be used for condensation of the resin containing a fluorene structure represented by the general formula (1) or (2) may be added. Addition of the monomer component has a merit of improving embedding characteristics without changing optical constant. The adding amount thereof is preferably 0 to 1,000 parts by mass, more preferably 0 to 500 parts by mass based on 100 parts by mass of the resin containing a fluorene structure represented by the general formula (1) or (2), and the adding amount can be appropriately adjusted while observing the embedding characteristics. If the adding amount of the monomer component is too much, it becomes an outgas during baking to generate particles, so that a baking furnace is contaminated in some cases. Thus, when the monomer component is added, it is preferred to keep the adding amount minimum which can ensure the embedding characteristics.

Conventionally, it has been required in the resist under layer film served as an antireflection film that there is no intermixing with the resist intermediate layer film containing silicon and the resist upper layer film formed on the resist under layer film, and that there is no diffusion of the low molecule component to the resist upper layer film and the resist intermediate layer film (Proc. SPIE Vol. 2195, p225-229 (1994)). To prevent these problems, there has generally been employed a method in which the material is thermally crosslinked by baking after spin coating of the antireflection film.

Therefore, in the present invention, when a crosslinking agent is added as a component of the material for forming a multi-layer film (an under layer film material, a later-described metal oxide film material, a later-described silicon oxide film material, a later-described hydrocarbon film material, etc.), a crosslinkable substituent may be introduced into the polymer used as the material. Even when the crosslinking agent is not added, the under layer film material having the resin containing a fluorene structure represented by the general formula (1) or (2) can be cured by heating at 250° C. or higher. Particularly, in the case of a novolac resin having a fluorene structure, the resin can be crosslinked by heating at 300° C. or higher according to the reaction mechanism mentioned later.

(Additives)

A crosslinking agent may be added to the material for forming a multi-layer film to be used in the method for forming a multi-layer film of the present invention. The crosslinking agent may be specifically exemplified by the materials disclosed in paragraphs (0055) to (0060) of Japanese Patent Laid-Open Publication No. 2007-199653.

Also, to the material for forming a multi-layer film to be used in the method for forming a multi-layer film of the present invention, an acid generator for further promoting the crosslinking reaction by heat can be added. As the acid generator, there is a material which generates an acid by heat decomposition or a material which generates an acid by photoirradiation, and either of which may be added. The acid generator may be specifically exemplified by the materials disclosed in paragraphs (0061) to (0085) of Japanese Patent Laid-Open Publication No. 2007-199653.

Further, to the material for forming a multi-layer film to be used in the method for forming a multi-layer film of the present invention, a basic compound for improving preservation stability may be added. The basic compound acts as a quencher to an acid for preventing the crosslinking reaction from promoting by an acid generated from the acid generator with a minor amount. Such a basic compound may be specifically exemplified by the materials disclosed in paragraphs (0086) to (0090) of Japanese Patent Laid-Open Publication No. 2007-199653.

Moreover, to the material for forming a multi-layer film to be used in the method for forming a multi-layer film of the present invention, a solvent such as an organic solvent and water is preferably added. The usable organic solvent is not particularly limited so long as it can dissolve the polymer, the acid generator, the crosslinking agent, and other additives to be used in the material. There may be specifically mentioned the solvents disclosed in paragraphs (0091) to (0092) of Japanese Patent Laid-Open Publication No. 2007-199653.

Furthermore, to the material for forming a multi-layer film to be used in the method for forming a multi-layer film of the present invention, a surfactant may be added for improving applicability by spin coating. The surfactant may be specifically exemplified by the materials disclosed in paragraphs (0165) to (0166) of Japanese Patent Laid-Open Publication No. 2008-111103.

The under layer film material to be used in the method for forming a multi-layer film of the present invention is applied onto a substrate to be processed by the spin coating method, etc., similarly to a photoresist film material mentioned later. By using the spin coating method, good embedding characteristics can be obtained.

Further, after spin coating, baking is carried out to evaporate the solvent whereby preventing mixing with the metal oxide film formed at the upper layer, and to promote the crosslinking reaction. The baking temperature is preferably 250° C. or higher and 800° C. or lower, more preferably 250° C. or higher and 700° C. or lower, much more preferably 300° C. or higher and 700° C. or lower, particularly preferably 350° C. or higher and 600° C. or lower. The baking time is preferably 10 to 4,000 seconds, more preferably 10 to 3,000 seconds, much more preferably 10 to 600 seconds. If the baking temperature is 250° C. or higher, the under layer film material can be efficiently cured, and if it is 800° C. or lower, there is no fear that the resin in the under layer film material is decomposed, so that this range is preferable. If the baking time is 10 seconds or more, the under layer film material can be efficiently cured, and if it is 4,000 seconds or less, there is no fear that throughput is lowered, so that this range is preferable. In addition, since the metal oxide film is formed on the under layer film at a temperature ranging from 250 to 600° C., baking under the above heat treatment conditions also allows to prevent outgas generating from the under layer film during the formation of the metal oxide film. Moreover, by baking the under layer film at ultrahigh temperature, etching resistance thereof can be enhanced when the substrate to be processed thereunder is subjected to dry etching.

The novolac resin generates phenoxy radicals by heating, and methylene groups of the novolac bonds are activated to crosslink the methylene groups to each other. Since this reaction is a radical reaction, no releasing molecule generates, so that no film shrinkage by crosslinking occurs if a material having high heat resistance is used. If oxygen is contained during baking, crosslinking due to oxidative coupling also proceeds. For promoting crosslinking by the oxidative coupling, baking in the atmosphere may be performed.

Baking may be carried out on a hot plate, or may be carried out in a furnace. When the furnace is used, a large amount of wafers can be treated at once, so that high throughput can be obtained.

Baking may be carried out in the atmosphere, or in an inert gas such as nitrogen, helium, and argon gas. When baking is carried out in the inert gas, shrinkage amount of the film can be reduced. In addition, when baking is carried out in the inert gas, oxidation can be prevented, so that the increase in absorption and the decrease in etching resistance can also be prevented. Baking in the inert gas is preferably carried out at baking after crosslinking. Also, for preventing oxidation, oxygen concentration is preferably controlled. The oxygen concentration in the inert gas is preferably 1,000 ppm or less, more preferably 100 ppm or less.

It may be also carried out baking for crosslinking after applying the under layer film material, followed by baking (high temperature baking) before formation of the metal oxide film. When the oxidative coupling reaction is used as the crosslinking reaction, it is preferred to carry out baking for crosslinking in the atmosphere firstly after applying, and then, high temperature baking in the inert gas.

Also, up to now, a fluorocarbon series gas has been used in dry etching of the substrate to be processed, a phenomenon that a line of the under layer film bends after dry etching occurs in some cases. This bending of the line is considered to be caused by the reason that the under layer film is fluorinated during dry etching whereby the volume thereof is increased. To the contrary, when an under layer film which had been subjected to high temperature baking is used as in the present invention, the under layer film becomes dense and rigid, so that there is a merit that bending of the line of the under layer film after dry etching difficulty occurs.

Incidentally, the thickness of the under layer film is appropriately selected, and it is preferred to set 30 to 20,000 nm, more preferably 50 to 15,000 nm, further preferably 80 to 10,000 nm.

[Step (2)]

In the step (2) of the method for forming a multi-layer film of the present invention, a metal oxide film material selected from a titanium oxide film material, a zirconium oxide film material, and a hafnium oxide film material is applied onto the under layer film formed as mentioned above, to form a metal oxide film.

(Metal Oxide Film)

The metal oxide film is preferably formed by the spin coating method. After spin coating, the temperature of the substrate is increased to, for example, 250° C. or higher, whereby a firm titanium oxide film, zirconium oxide film, or hafnium oxide film can be formed.

As for the metal oxide film material selected from a titanium oxide film material, a zirconium oxide film material, and a hafnium oxide film material, materials and a manufacturing method disclosed in Japanese Patent Laid-Open Publication No. 2014-134581 can be suitably used. In this manufacturing method, hydrolysis condensate of titanium alkoxide, zirconium alkoxide, or hafnium alkoxide and a compound stabilized by a bulky aromatic ligand are used. Besides the compound stabilized by a bulky aromatic ligand, a compound stabilized by coordinating with a bulky diol compound or aminoalcohol may also be used. In such materials, the ligand is separated by baking after applying to form a metal oxide film.

The thickness of the metal oxide film is preferably 3 to 100 nm, more preferably 5 to 50 nm. The metal oxide film (hard mask) selected from a titanium oxide film, a zirconium oxide film, and a hafnium oxide film may be thin because it has excellent dry etching resistance.

Onto the metal oxide film, a hydrocarbon film for usual tri-layer process is formed (Step (3)), a silicon oxide film is formed thereon (Step (4)), and a photoresist film is further formed thereon (Step (A) of the patterning process mentioned later). Exposure light is reflected on the metal oxide film, and does not reach to the under layer film under the same. Reflection can be suppressed by controlling a phase and an absorption of the two layers of the hydrocarbon film and the silicon oxide film on the metal oxide film as antireflection films. If the n value of the refractive index of the hydrocarbon film is close to the n value of the photoresist film, reflection of the substrate can be made 1% or less even when the film thickness of the silicon oxide film is 20 nm or less. As described above, one of the objects of the present invention is to accomplish both of reducing reflectance of the substrate and thinning the silicon oxide film. Accordingly, it is important to select a material having a high n value for the hydrocarbon film under the silicon oxide film to make the silicon oxide film just below the photoresist film a thin film having a film thickness of 20 nm or less.

[Step (3)]

In the step (3) of the method for forming a multi-layer film of the present invention, a hydrocarbon film material is applied onto the metal oxide film formed as mentioned above to form a hydrocarbon film.

(Hydrocarbon Film)

As the hydrocarbon film material to be used in the method for forming a multi-layer film of the present invention, a material having high carbon density and high etching resistance is selected. Illustrative examples of such a material include a novolac resin prepared by phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, 7-methoxy-2-naphthol, dihydroxynaphthalene such as 1,5-dihydroxynaphthalene, 1,7-dihydroxynaphthalene, and 2,6-dihydroxynaphthalene, methyl 3-hydroxy-naphthalene-2-carboxylate, indene, hydroxyindene, benzofuran, hydroxyanthrathene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, limonene, etc.; polyhydroxystyrene, polystyrene, polyvinylnaphthalene, polyvinylanthrathene, polyvinylcarbazole, polyindene, polyacenaphthylene, polynorbornene, polycyclodecene, polytetraclododecene, polynortricyclene, poly(meth)acrylate, and a copolymer thereof.

In addition, it may be blended with a resin compound such as a nortricyclene copolymer disclosed in Japanese Patent Laid-Open Publication No. 2004-205658, a hydrogenated naphthol novolac resin disclosed in Japanese Patent Laid-Open Publication No. 2004-205676, a naphthol dicyclopentadiene copolymer disclosed in Japanese Patent Laid-Open Publication No. 2004-205685, a phenol dicyclopentadiene copolymer disclosed in Japanese Patent Laid-Open Publication No. 2004-354554 and No. 2005-010431, a fluorene bisphenol novolac resin disclosed in Japanese Patent Laid-Open Publication No. 2005-128509, an acenaphthylene copolymer disclosed in Japanese Patent Laid-Open Publication No. 2005-250434, an indene copolymer disclosed in Japanese Patent Laid-Open Publication No. 2006-053543, a fullerene having a phenol group disclosed in Japanese Patent Laid-Open Publication No. 2006-227391, a bisphenol compound and a novolac resin thereof disclosed in Japanese Patent Laid-Open Publication No. 2006-259249, No. 2006-293298 and No. 2007-316282, a dibisphenol compound and a novolac resin thereof disclosed in Japanese Patent Laid-Open Publication No. 2006-259482, a novolac resin of an adamantanephenol compound disclosed in Japanese Patent Laid-Open Publication No. 2006-285095, a hydroxyvinyl-naphthalene copolymer disclosed in Japanese Patent Laid-Open Publication No. 2007-171895, a bisnaphthol compound and a novolac resin thereof disclosed in Japanese Patent Laid-Open Publication No. 2007-199653, ROMP (Ring-Opening Metathesis Polymer) disclosed in Japanese Patent Laid-Open Publication No. 2008-026600, and a tricyclopentadiene copolymerized material disclosed in Japanese Patent Laid-Open Publication No. 2008-096684.

Among these materials, a material having a high n value is a material in which the content of an aromatic group is low and the ratio of an alicyclic group is high. For example, a resin containing dicyclopentadiene, tricyclopentadiene, acenaphthylene, adamantane, ROMP and/or a nortricyclene series material is more suitable than a novolac series material. These materials have a high n value, so that even when the film thickness of the silicon oxide film thereon is thinned to 20 nm or less, reflectance of the substrate can be suppressed to 1% or less.

In the method for forming a multi-layer film of the present invention, the hydrocarbon film is preferably formed by the spin coating method. The film thickness of the hydrocarbon film is preferably in the range of 5 to 100 nm, more preferably 10 to 80 nm.

[Step (4)]

In the step (4) of the method for forming a multi-layer film of the present invention, a silicon oxide film material is applied onto the hydrocarbon film formed as mentioned above to form a silicon oxide film.

(Silicon Oxide Film)

As the silicon oxide film material to be used in the method for forming a multi-layer film of the present invention, there may be mentioned a silsesquioxane type material having an absorption at the exposure wavelength as disclosed in Japanese Patent Laid-Open Publication No. 2007-302873.

In the method for forming a multi-layer film of the present invention, the silicon oxide film is preferably formed by the spin coating method. The film thickness of the silicon oxide film is preferably 10 to 20 nm.

A multi-layer film laminated in the order of the under layer film, the metal oxide film, the hydrocarbon film, and the silicon oxide film onto the substrate can be formed by the method including the steps (1) to (4) as explained above.

When such a method for forming a multi-layer film is employed, a multi-layer film that can be suitably used as the resist under layer film in the lithography, has an optimum n value and k value and embedding characteristics as the antireflection film, and further has excellent etching resistance can be formed.

In addition, when all of the films are formed by the spin coating method, the cost can be reduced compared with a method for forming films by sputtering or CVD.

<Patterning Process>

The present invention provides a patterning process using the multi-layer film formed as mentioned above, which includes the steps of:

(A) forming a photoresist film on a multi-layer film which has been formed on a substrate by the above-mentioned method for forming a multi-layer film;

(B) forming a photoresist pattern by subjecting the photoresist film to exposure and development;

(C) transferring the pattern to the silicon oxide film by dry etching using the photoresist pattern as a mask;

(D) transferring the pattern to the hydrocarbon film by dry etching using the silicon oxide film to which the pattern has been transferred as a mask;

(E) transferring the pattern to the metal oxide film by dry etching using the hydrocarbon film to which the pattern has been transferred as a mask; and (F) transferring the pattern to the under layer film by dry etching using the metal oxide film to which the pattern has been transferred as a mask.

Hereinafter, an example of the patterning process (penta-layer (5-layer) process) of the present invention is explained by referring to FIG. 2, but the patterning process of the present invention is not limited thereto.

Figure 2:
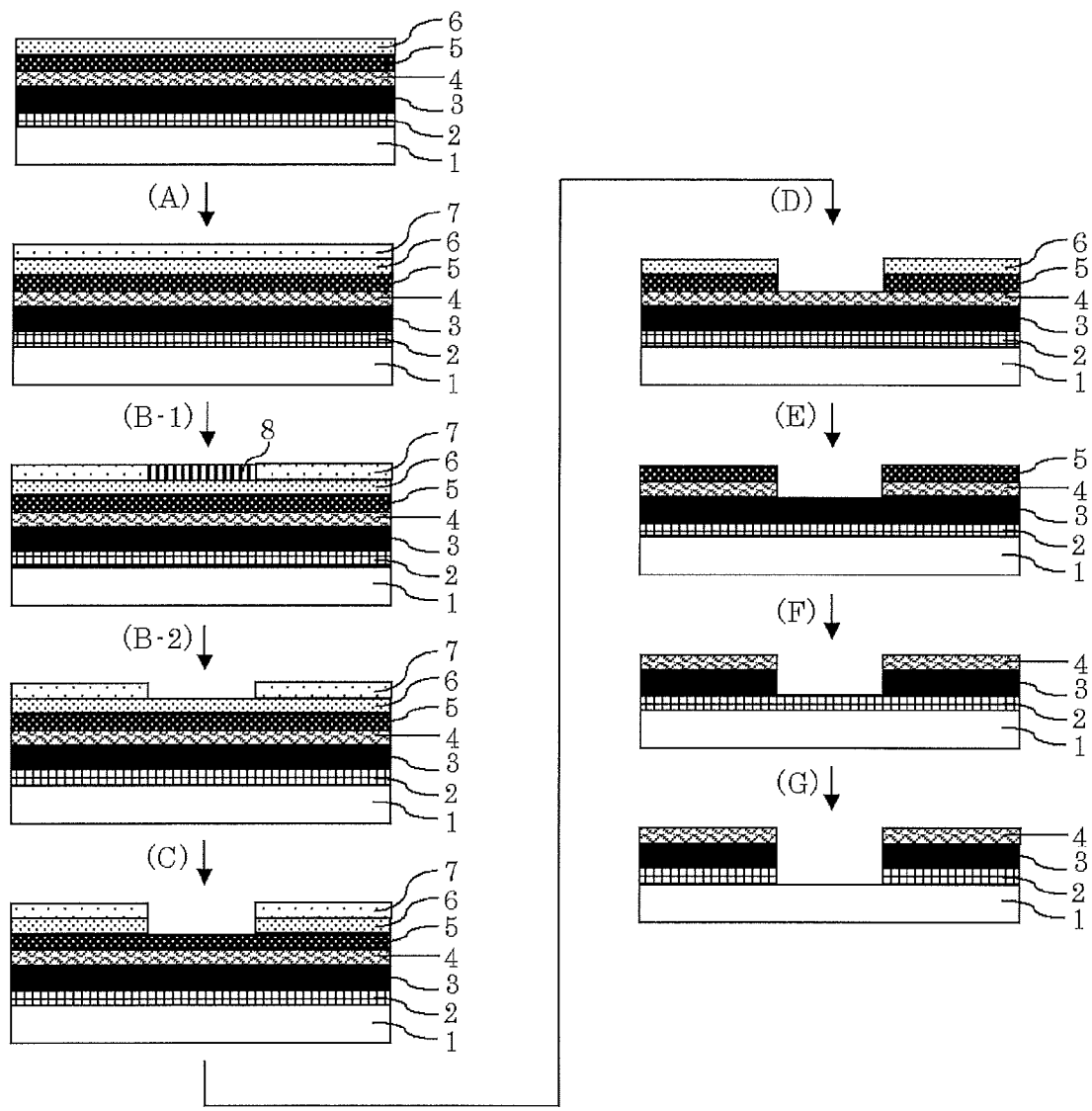
FIG. 2 is a flow chart showing an example of the patterning process of the present invention.

In the patterning process of FIG. 2, as the step (A), a photoresist film 7 is firstly formed onto a multi-layer film (a silicon oxide film 6 at the uppermost layer) formed on a substrate by the method for forming a multi-layer film mentioned above (FIG. 2(A)).

The photoresist film 7 may be either a positive type or a negative type, and the same material as the commonly used photoresist composition may be used. Also, when a single layer photoresist film is to be formed by the photoresist composition, the spin coating method is preferably used similarly to the case where the under layer film or the like is formed. After spin coating of the photoresist composition, pre-baking is preferably carried out under the conditions of at 60 to 180° C. for 10 to 300 seconds. The thickness of the photoresist film is not particularly limited, and preferably in the range of 30 to 500 nm, particularly preferably 50 to 400 nm.

Next, as the step (B), prescribed portions (exposed portions 8) of the photoresist film 7 are exposed (FIG. 2 (B-1)), and after subjecting to post exposure baking (PEB), development is carried out to form a photoresist pattern (FIG. 2 (B-2)). In the case of the positive pattern, as shown in FIG.

2, the exposed portions 8 are dissolved in the developer, whereas in the case of the negative pattern, unexposed portions are dissolved in the developer.

As the exposure light, there may be mentioned a high energy beam having a wavelength of 300 nm or less, more specifically, far ultraviolet rays, KrF excimer laser light (248 nm), ArF excimer laser light (193 nm), F2 laser light (157 nm), $Kr_2$ laser light (146 nm), Are laser light (126 nm), soft X-ray having a wavelength of 3 to 20 nm (e.g., EUV (wavelength 13.5 nm)), electron beam (EB), X-ray, etc.

Next, as the step (C), dry etching is carried out using the photoresist pattern as a mask to transfer the pattern to the silicon oxide film 6 (FIG. 2(C)).

As the etching gas to be used in the step (C), a fluorocarbon series gas is suitable.

Next, as the step (D), dry etching is carried out using the silicon oxide film 6 to which the pattern has been transferred as a mask to transfer the pattern to the hydrocarbon film 5 (FIG. 2(D)).

As the etching gas to be used in the step (D), one or more gases selected from an oxygen gas, a hydrogen gas, an ammonia gas, a carbon dioxide gas, a carbon monoxide gas, and a sulfur dioxide gas are suitable.

Also, the dry etching of the step (D) may be an oxygen plasma etching.

Next, as the step (E), dry etching is carried out using the hydrocarbon film 5 to which the pattern has been transferred as a mask to transfer the pattern to the metal oxide film 4 (FIG. 2(E)).

As the etching gas to be used in the step (E), a gas containing bromine or chlorine is suitable.

Next, as the step (F), dry etching is carried out using the metal oxide film 4 to which the pattern has been transferred as a mask to transfer the pattern to the under layer film 3 (FIG. 2(F)).

As the etching gas to be used in the step (F), one or more gases selected from an oxygen gas, a hydrogen gas, an ammonia gas, a carbon dioxide gas, a carbon monoxide gas, and a sulfur dioxide gas are suitable.

Further, as the step (G), dry etching may be carried out using the metal oxide film 4 to which the pattern has been transferred and the under layer film 3 to which the pattern has been transferred as masks to transfer the pattern to the layer to be processed 2 of the substrate 1 (FIG. 2(G)).

As the etching gas to be used in the step (G), when the layer to be processed 2 is $SiO_2$, SiN, or a silica series low dielectric constant insulating film, an etching gas mainly composed of a fluorocarbon series gas is suitable, and when the layer to be processed 2 is p-Si, Al, or W, an etching gas mainly composed of a chlorine series or bromine series gas is suitable.

Incidentally, in the present invention, the metal oxide film 4 and the under layer film 3 are films both having resistance to the etching gas for the layer to be processed 2.

According to the patterning process of the present invention as explained above, a pattern is formed by a 5-layer (penta-layer) process using a photoresist film and a multilayer film having optimum n value and k value, embedding characteristics as an antireflection film, and excellent etching resistance, so that, in particular, even when a negative tone resist pattern developed by an organic solvent which is thin and vulnerable in dry etching resistance is used, the pattern can be transferred with high accuracy.

EXAMPLES

In the following, the present invention is explained more specifically by referring to Examples and Comparative Examples, but the present invention is not limited to these.

Incidentally, the molecular weight of the polymer indicates a weight average molecular weight (Mw), a number average molecular weight (Mn), a dispersity (Mw/Mn) in terms of polystyrene by gel permeation chromatography (GPC).

Under layer film polymers 1 to 8 and Under layer film monomers 1 and 2 for blend used in the under layer film materials are shown below.

Under layer film polymer 1: Mw=3,500, Mw/Mn=4.50

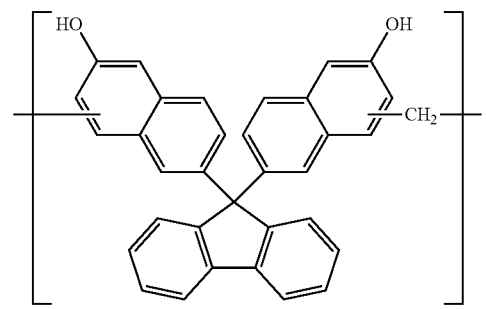

Under layer film polymer 1

Under layer film polymer 2: Mw=3,100, Mw/Mn=4.80

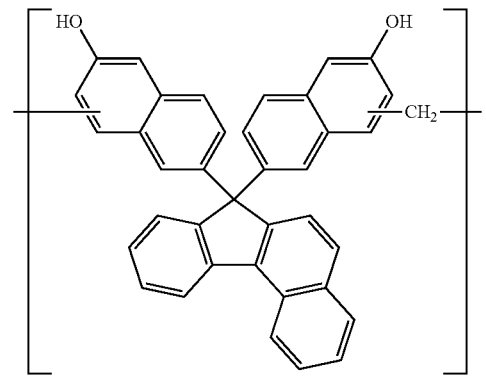

Under layer film polymer 2

Under layer film polymer 3: Mw=2,600, Mw/Mn=5.10
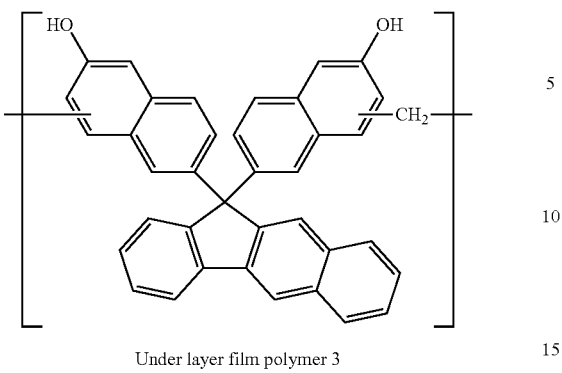
Under layer film polymer 3
Under layer film polymer 4: Mw=3,600, Mw/Mn=4.80
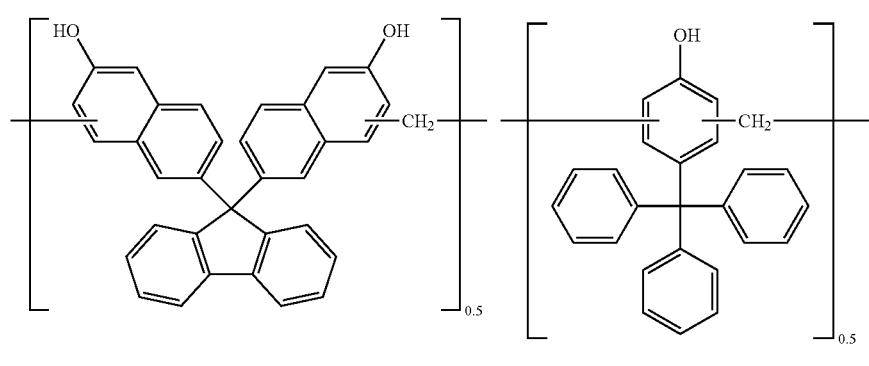
Under layer film polymer 3
Under layer film polymer 5: Mw=3,200, Mw/Mn=5.40
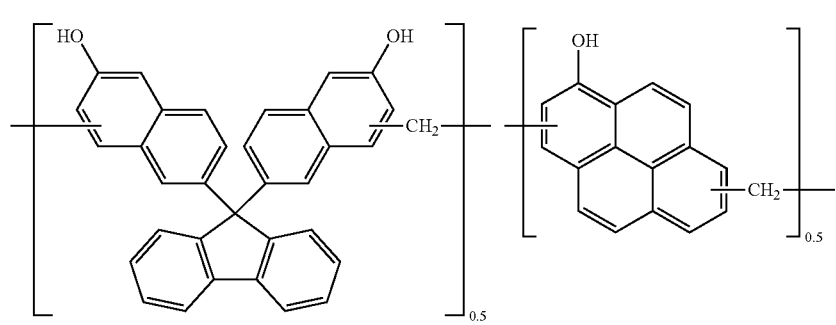
Under layer film polymer 3
Under layer film polymer 6: Mw=6,200, Mw/Mn=6.40
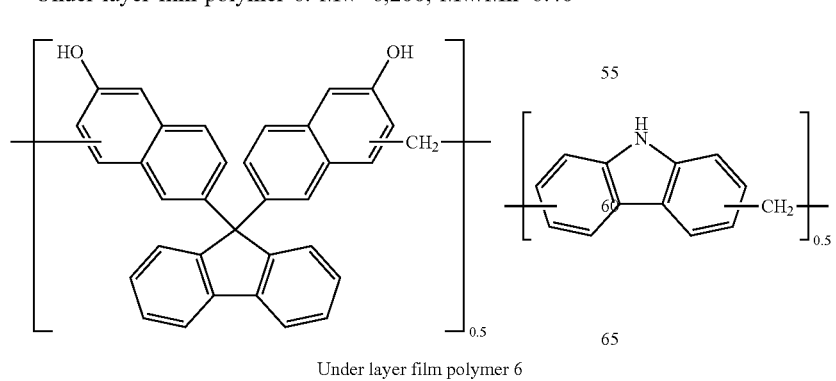
Under layer film polymer 6

Under layer film polymer 7: Mw=6,500, Mw/Mn=5.20

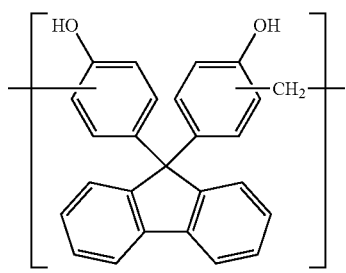

Under layer film polymer 7

Under layer film polymer 8: Mw=3,200, Mw/Mn=5.40

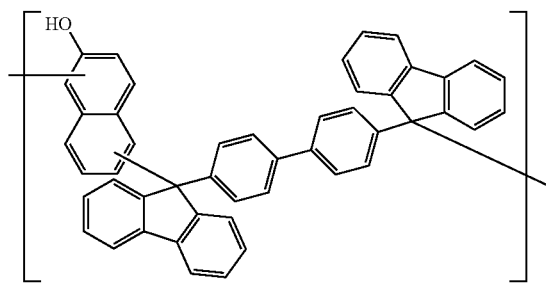

Under layer film polymer 8

Under layer film monomers 1 and 2 for blend

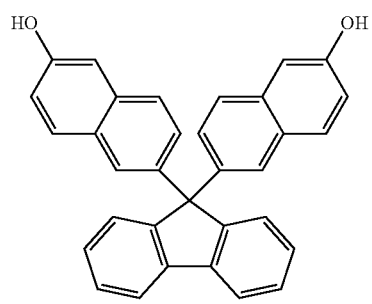

Under layer film monomer 1 for blend

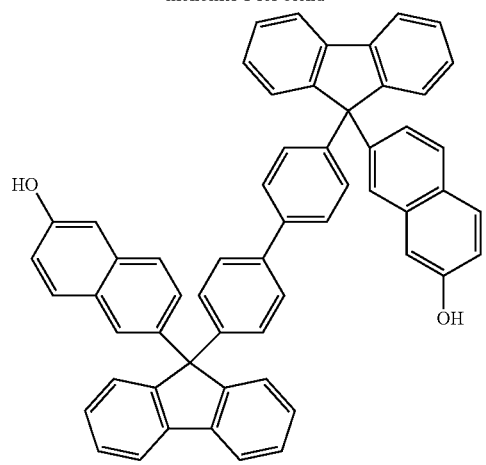

Under layer film monomer 2 for blend

Titanium oxide film polymers 1 and 2, Zirconium oxide film polymer 1, and Hafnium oxide film polymer 1 used in the metal oxide film materials are shown below.

Titanium oxide film polymer 1: Mw=1,200, Mw/Mn=1.80

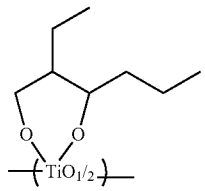

Titanium oxide film polymer 1

Titanium oxide film polymer 2: Mw=1,200, Mw/Mn=1.90

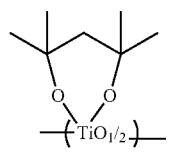

Titanium oxide film polymer 2

Zirconium oxide film polymer 1: Mw=1,500, Mw/Mn=1.90

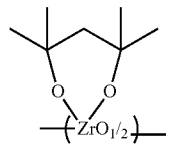

Zirconium oxide film polymer 1

Hafnium oxide film polymer 1: Mw=1,100, Mw/Mn=1.90

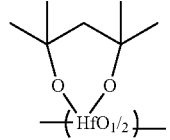

Hafnium oxide film polymer 1

Hydrocarbon film polymers 1 to 4 used in the hydrocarbon film materials are shown below. In Comparative Examples, Hydrocarbon film polymers 1 and 3 were used for the under layer film material.

Hydrocarbon film polymer 1 (Comparative under layer film polymer 1): Mw=6,900, Mw/Mn=1.88

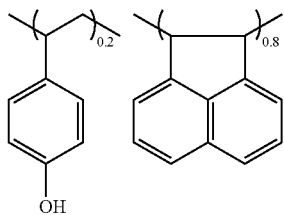

Hydrocarbon film polymer 1
(Comparative under layer film polymer 1)

Hydrocarbon film polymer 2: Mw=7,200, Mw/Mn=1.79

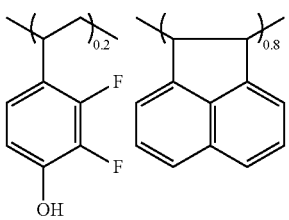

Hydrocarbon film polymer 2

Hydrocarbon film polymer 3 (Comparative under layer film polymer 2): Mw=890, Mw/Mn=3.53

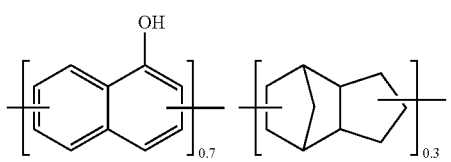

Hydrocarbon film polymer 3
(Comparative under layer film polymer 2)

Hydrocarbon film polymer 4: Mw=9,900, Mw/Mn=1.23

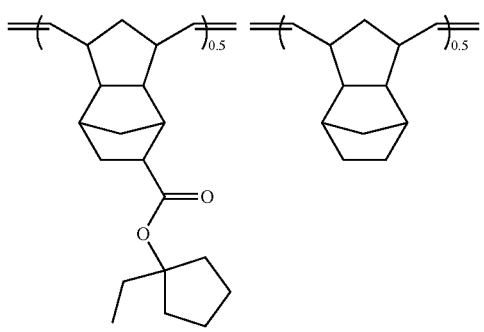

Hydrocarbon film polymer 4

Silicon oxide film polymer 1 used in the silicon oxide film materials is shown below.

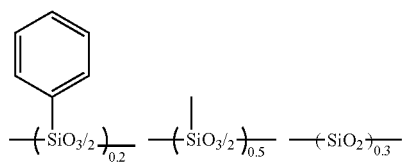

Silicon oxide film polymer 1

Acid generators AG1 and AG2, and Crosslinking agent CR1 used in the under layer film materials, the hydrocarbon film materials, and the silicon oxide film materials are shown below.

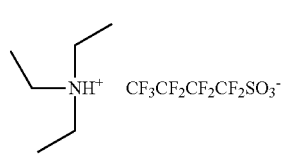

AG1

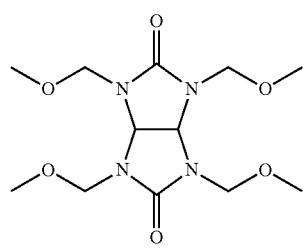

CR1

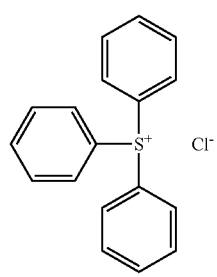

AG2

ArF resist polymer 1, Acid generator PAG1, Quencher, and Water-repellent polymer 1 used in the photoresist film materials are shown below.

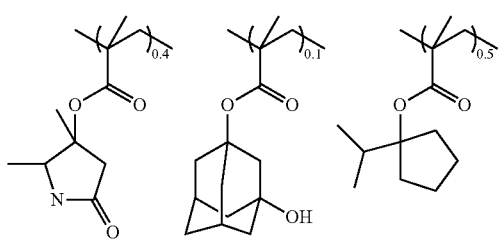

ArF resist polymer 1

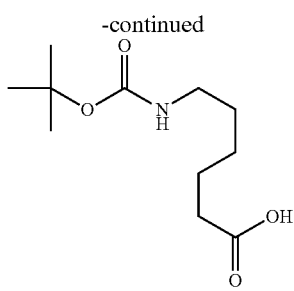

Quencher

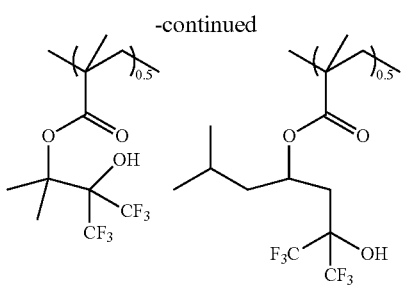

Water-repellent polymer 1

The solvents used in the under layer film materials, the metal oxide film materials, the hydrocarbon film materials, the silicon oxide film materials, and the photoresist film materials are shown below.

PGMEA: Propylene glycol monomethyl ether acetate
Cyclohexanone
Water
PGEE: Propylene glycol monoethyl ether
GBL: γ-butyrolactone Preparation of Under Layer Film Materials (UDL-1 to 10 and Comparative UDL-1)

The resins shown by Under layer film polymers 1 to 8 and Comparative under layer film polymers 1 and 2 (Hydrocarbon film polymers 1 and 3), Under layer film monomers 1 and 2 for blend, Acid generator AG1, and Crosslinking agent CR1 were dissolved in a solvent containing 0.1% by mass of FC-4430 (available from Sumitomo 3M Ltd.) with the ratio shown in Table 1, and the solutions were filtered through a filter made of a fluorine resin having a pore size of 0.1 μm to prepare under layer film materials (UDL-1 to 10 and Comparative UDL-1).

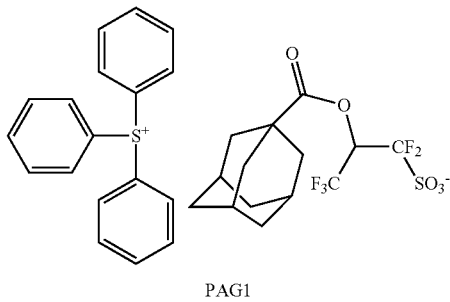

PAG1

TABLE 1

| Under layer film material | Polymer (parts by mass) | Crosslinking agent (parts by mass) | Acid generator (parts by mass) | Surfactant (% by mass) | Solvent (parts by mass) |
|---|---|---|---|---|---|
| UDL-1 | Under layer film polymer 1 (10) | — | — | FC-4430 (0.1) | PGMEA (200) |
| UDL-2 | Under layer film polymer 2 (10) | — | — | FC-4430 (0.1) | PGMEA (100) Cyclohexanone (100) |
| UDL-3 | Under layer film polymer 3 (10) | — | — | FC-4430 (0.1) | PGMEA (100) Cyclohexanone (100) |
| UDL-4 | Under layer film polymer 4 (10) | — | — | FC-4430 (0.1) | PGMEA (100) Cyclohexanone (100) |
| UDL-5 | Under layer film polymer 5 (10) | — | — | FC-4430 (0.1) | PGMEA (100) Cyclohexanone (100) |
| UDL-6 | Under layer film polymer 6 (10) | — | — | FC-4430 (0.1) | PGMEA (100) Cyclohexanone (100) |
| UDL-7 | Under layer film polymer 7 (10) | — | — | FC-4430 (0.1) | PGMEA (100) Cyclohexanone (100) |
| UDL-8 | Under layer film polymer 8(6) Under layer film monomer 1 for blend(5) | — | — | FC-4430 (0.1) | PGMEA (100) Cyclohexanone (100) |
| UDL-9 | Under layer film polymer 1(5) Under layer film monomer 1 for blend(5) | — | — | FC-4430 (0.1) | PGMEA (200) |
| UDL-10 | Under layer film polymer 1(5) | — | — | FC-4430 (0.1) | PGMEA (200) |

TABLE 1-continued

| Under layer film material | Polymer (parts by mass) | Crosslinking agent (parts by mass) | Acid generator (parts by mass) | Surfactant (% by mass) | Solvent (parts by mass) |
|---|---|---|---|---|---|
| | Under layer film monomer 1 for blend(2) | | | | |
| | Under layer film monomer 2 for blend(3) | | | | |
| Comparative UDL-1 | Comparative under layer film polymer 1(5) | CR1 (1) | AG1 (0.2) | FC-4430 (0.1) | PGMEA (200) |
| | Comparative under layer film polymer 2(5) | | | | |

Preparation of Metal Oxide Film Materials (MHL-1 to 4)

The resins shown by Titanium oxide film polymers 1 and 2, Zirconium oxide film polymer 1, and Hafnium oxide film polymer 1 were each dissolved in a solvent containing 0.1% by mass of FC-4430 (available from Sumitomo 3M Ltd.) with the ratio shown in Table 2, and the solutions were filtered through a filter made of a fluorine resin having a pore size of 0.1 μm to prepare metal oxide film materials (MHL-1 to 4).

TABLE 2

| Metal oxide film material | Polymer (parts by mass) | Surfactant (% by mass) | Solvent (parts by mass) |
|---|---|---|---|
| MHL-1 | Titanium oxide film polymer 1 (5) | FC-4430 (0.1) | PGMEA (800) |
| MHL-2 | Titanium oxide film polymer 2 (5) | FC-4430 (0.1) | PGMEA (800) |
| MHL-3 | Zirconium oxide film polymer 1 (5) | FC-4430 (0.1) | PGMEA (800) |
| MHL-4 | Hafnium oxide film polymer 1 (5) | FC-4430 (0.1) | PGMEA (800) |

Preparation of Hydrocarbon Film Materials (HCL-1 to 3)

The resins shown by Hydrocarbon film polymers 1 to 4, Acid generator AG1, and Crosslinking agent CR1 were dissolved in a solvent containing 0.1% by mass of FC-4430 (available from Sumitomo 3M Ltd.) with the ratio shown in Table 3, and the solutions were filtered through a filter made of a fluorine resin having a pore size of 0.1 μm to prepare hydrocarbon film materials (HCL-1 to 3).

TABLE 3

| Hydrocarbon film material | Polymer (parts by mass) | Crosslinking agent (parts by mass) | Acid generator (parts by mass) | Surfactant (% by mass) | Solvent (parts by mass) |
|---|---|---|---|---|---|
| HCL-1 | Hydrocarbon film polymer 1(5) Hydrocarbon film polymer 3(5) | CR1 (1) | AG1 (0.2) | FC-4430 (0.1) | PGMEA (400) |
| HCL-2 | Hydrocarbon film polymer 2(5) Hydrocarbon film polymer 3(5) | CR1 (1) | AG1 (0.2) | FC-4430 (0.1) | PGMEA (400) |
| HCL-3 | Hydrocarbon film polymer 1(5) Hydrocarbon film polymer 4(5) | — | — | FC-4430 (0.1) | PGMEA (200) Cyclohexanone (200) |

Preparation of Silicon Oxide Film Material (SOG-1)

The resin shown by Silicon oxide film polymer 1 and Acid generator AG2 were dissolved in a solvent containing 0.1% by mass of FC-4430 (available from Sumitomo 3M Ltd.) with the ratio shown in Table 4, and the solution was filtered through a filter made of a fluorine resin having a pore size of 0.1 μm to prepare Silicon oxide film material (SOG-1).

TABLE 4

| Silicon oxide film material | Polymer (parts by mass) | Acid generator (part by mass) | Surfactant (% by mass) | Solvent (parts by mass) |
|---|---|---|---|---|
| SOG-1 | Silicon oxide film polymer 1(5) | AG2 (0.2) | FC-4430 (0.1) | PGEE (1000) Water (100) |

Preparation of Photoresist Film Material (ArF Resist 1)

The resin shown by ArF resist polymer 1, Acid generator PAG1, Quencher, and Water-repellent polymer 1 were dissolved in a solvent containing 0.1% by mass of FC-4430 (available from Sumitomo 3M Ltd.) with the ratio shown in Table 5, and the solution was filtered through a filter made of a fluorine resin having a pore size of 0.1 μm to prepare a photoresist film material (ArF resist 1).

TABLE 5

| Photoresist film material | Polymer (parts by mass) | Acid generator (parts by mass) | Quencher (parts by mass) | Water-repellent agent (parts by mass) | Surfactant (% by mass) | Solvent (parts by mass) |
|---|---|---|---|---|---|---|
| ArF resist 1 | ArF resist polymer 1 (100) | PAG1 (15.0) | Quencher (2.5) | Water-repellent polymer 1 (5.0) | FC-4430 (0.1) | PGMEA (3000) GBL (15) |

Measurements of Refractive Index of Under Layer Film and Film Thickness Before and after High Temperature Baking The under layer film materials (UDL-1 to 10 and Comparative UDL-1) were each applied onto a silicon substrate (wafer), and baked at 200° C. for 60 seconds to form under layer films each having a film thickness of 100 nm, and refractive index (n value and k value) at a wavelength of 193 nm and film thickness "a" after baking at 200° C. of each under layer film were measured by an incident angle variable spectroscopic ellipsometer (VASE; manufactured by J.A. Woollam Co., Inc.). Then, as to UDL-1 to 8 and Comparative UDL-1, the wafer was baked on a hot plate at 350° C. for 1 minute, film thickness "b" after baking at 350° C. was measured, and the ratio of the film thicknesses before and after baking at 350° C. was calculated. As to UDL-9 and 10, the wafer was put into a furnace filled with nitrogen to adjust oxygen concentration to 10 ppm or less, and baked at 450° C. for 30 minutes, film thickness "b" after baking at 450° C. was measured, and the ratio of the film thicknesses before and after baking at 450° C. was calculated. The results are shown in Tables 6 and 7.

TABLE 6

| Under layer film material | Film thickness "a" after baking at 200° C. (nm) | Refractive index n value | Refractive index k value | Film thickness "b" after baking at 350° C. (nm) | Ratio of film thicknesses before and after baking at 350° C. b/a × 100(%) |
|---|---|---|---|---|---|
| UDL-1 | 105 | 1.33 | 0.44 | 102 | 98 |
| UDL-2 | 106 | 1.32 | 0.46 | 105 | 99 |
| UDL-3 | 92 | 1.31 | 0.47 | 91 | 99 |
| UDL-4 | 101 | 1.33 | 0.46 | 98 | 97 |
| UDL-5 | 106 | 1.38 | 0.50 | 104 | 98 |
| UDL-6 | 107 | 1.37 | 0.48 | 104 | 97 |
| UDL-7 | 102 | 1.38 | 0.50 | 100 | 98 |
| UDL-8 | 101 | 1.37 | 0.48 | 97 | 96 |
| Comparative UDL-1 | 99 | 1.35 | 0.64 | 36 | 81 |

TABLE 7

| Under layer film material | Film thickness "a" after baking at 200° C. (nm) | Refractive index n value | Refractive index k value | Film thickness "b" after baking at 450° C. (nm) | Ratio of film thicknesses before and after baking at 450° C. b/a × 100(%) |
|---|---|---|---|---|---|
| UDL-9 | 105 | 1.33 | 0.43 | 95 | 91 |
| UDL-10 | 106 | 1.32 | 0.48 | 93 | 88 |

Measurement of Refractive Index of Metal Oxide Film, Hydrocarbon Film, and Silicon Oxide Film The metal oxide film materials (MHL-1 to 4), the hydrocarbon film materials (HCL-1 to 3), and the silicon oxide film material (SOG-1) were each applied onto a silicon substrate. The metal oxide film materials were baked at 350° C. for 60 seconds, and the other materials were baked at 200° C. for 60 seconds to form a metal oxide film with a film thickness of 20 nm, a hydrocarbon film with a film thickness of 40 nm, and a silicon oxide film with a film thickness of 20 nm. Then, refractive index (n value and k value) of each film at a wavelength of 193 nm was measured by an incident angle variable spectroscopic ellipsometer (VASE; manufactured by J.A. Woollam Co., Inc.). The results are shown in Table 8.

TABLE 8

| Film material | Refractive index n value | Refractive index k value |
|---|---|---|
| MHL-1 (Metal oxide film) | 1.62 | 0.71 |
| MHL-2 (Metal oxide film) | 1.60 | 0.70 |
| MHL-3 (Metal oxide film) | 1.58 | 0.75 |
| MHL-4 (Metal oxide film) | 1.53 | 0.77 |
| HCL-1 (Hydrocarbon film) | 1.50 | 0.30 |
| HCL-2 (Hydrocarbon film) | 1.55 | 0.28 |
| HCL-3 (Hydrocarbon film) | 1.61 | 0.31 |
| SOG-1 (Silicon oxide film) | 1.60 | 0.20 |

Pattern Etching Test

Formation of Multi-Layer Film

Examples 1 to 15 and Comparative Example 1

Each of the under layer film materials (UDL-1 to 8 and Comparative UDL-1) shown in Table 1 was applied by spin coating onto a Si wafer substrate having a diameter of 300 mm on which a SiO$_2$ film (a layer to be processed) having a film thickness of 200 nm has been formed, and baked at 350° C. for 60 seconds to form an under layer film having a film thickness of 100 nm (Examples 1 to 13 and Comparative Example 1). Similarly, each of the under layer film materials (UDL-9 and 10) shown in Table 1 was applied by spin coating onto a Si wafer substrate having a diameter of 300 mm on which a SiO$_2$ film (a layer to be processed) having a film thickness of 200 nm has been formed, and baked at 350° C. for 60 seconds. Thereafter, the wafer was put into a furnace filled with nitrogen to adjust oxygen concentration to 10 ppm or less, and baked at 450° C. for 30 minutes to form an under layer film having a film thickness of 100 nm (Examples 14 and 15).

Then, onto the substrate having the under layer film thus formed, the metal oxide film materials (MHL-1 to 4) shown in Table 2 were applied by spin coating, and baked at 350° C. for 60 seconds to form a metal oxide film having a film thickness of 20 nm. Subsequently, the hydrocarbon film materials (HCL-1 to 3) shown in Table 3 were applied thereto by spin coating, and baked at 220° C. for 60 seconds to form a hydrocarbon film having a film thickness of 40 nm. Further, the silicon oxide film material (SOG-1) shown in Table 4 was applied thereto by spin coating, and baked at 200° C. for 60 seconds to form a silicon oxide film having a film thickness of 20 nm, thereby obtaining a multi-layer film (4 layers).

Comparative Example 2

The under layer film material (UDL-1) shown in Table 1 was applied by spin coating onto a Si wafer substrate having a diameter of 300 mm on which a SiO$_2$ film (a layer to be processed) having a film thickness of 200 nm has been formed, and baked at 350° C. for 60 seconds to form an under layer film having a film thickness of 100 nm. In Comparative Example 2, a silicon oxide film material (SOG-1) was applied onto the under layer film by spin coating without forming the metal oxide film and the hydrocarbon film, and baked at 200° C. for 60 seconds to form a silicon oxide film having a film thickness of 20 nm, thereby obtaining a multi-layer film (2 layers).

[Formation of Pattern]

The ArF resist shown in Table 5 was applied by spin coating onto each of the substrates of Examples 1 to 15 and Comparative Examples 1 and 2 on which the multi-layer film has been formed as mentioned above, and baked at 100° C. for 60 seconds to form a photoresist film having a film thickness of 70 nm. According to this procedure, Examples 1 to 15 and Comparative Example 1 have formed a structure of a penta-layer (5 layers) and Comparative Example 2 have formed a structure of a tri-layer (3 layers).

These samples were exposed by using an ArF excimer laser liquid immersion scanner (NSR-610C; manufactured by Nikon Corporation, NA=1.30, σ=0.98/0.78, dipole opening 20°, Azimuthally polarized illumination, 6% halftone phase shift mask) while changing the exposure dose, and after the exposure, baked (PEB) at 80° C. for 60 seconds, developed by 2.38% by mass of an aqueous tetramethylammonium hydroxide (TMAH) solution for 30 seconds, rinsed with pure water, and spin-dried to form a 40 nm line and space pattern.

Then, (a) dry etching was carried out by using the resist pattern thus formed as a mask to transfer the pattern to the silicon oxide film, (b) dry etching was carried out by using the obtained silicon oxide film pattern as a mask to transfer the pattern to the hydrocarbon film, (c) dry etching was carried out by using the obtained hydrocarbon film pattern as a mask to transfer the pattern to the metal oxide film, (d) dry etching was carried out by using the obtained metal oxide film pattern as a mask to transfer the pattern to the under layer film, and (e) dry etching was carried out by using the metal oxide film pattern and the obtained under layer film pattern as masks to transfer the pattern to the SiO$_2$ film, whereby processing the layer to be processed.

Etching conditions are as shown below.

(a) Transfer (etching) conditions of resist pattern to silicon oxide film

| | |
|---|---|
| Chamber pressure | 10.0 Pa |
| RF power | 1,500 W |
| CF$_4$ gas flow rate | 75 mL/min |
| O$_2$ gas flow rate | 15 mL/min |
| Time | 12 sec |

(b) Transfer (etching) conditions of silicon oxide film pattern to hydrocarbon film

| | |
|---|---|
| Chamber pressure | 2.0 Pa |
| RF power | 500 W |
| Ar gas flow rate | 75 mL/min |
| O$_2$ gas flow rate | 45 mL/min |
| Time | 30 sec |

(c) Transfer (etching) conditions of hydrocarbon film pattern to metal oxide film

| | |
|---|---|
| Chamber pressure | 40.0 Pa |
| RF power | 300 W |
| Cl$_2$ gas flow rate | 30 mL/min |
| BCl$_3$ gas flow rate | 30 mL/min |
| CHF$_3$ gas flow rate | 100 mL/min |
| O$_2$ gas flow rate | 2 mL/min |
| Time | 30 sec |

(d) Transfer (etching) conditions of metal oxide film pattern to under layer film

| | |
|---|---|
| Chamber pressure | 2.0 Pa |
| RF power | 500 W |
| Ar gas flow rate | 75 mL/min |
| O$_2$ gas flow rate | 45 mL/min |
| Time | 100 sec |

(e) Transfer (etching) conditions of metal oxide film pattern and under layer film pattern to SiO$_2$ film

| | |
|---|---|
| Chamber pressure | 2.0 Pa |
| RF power | 2,200 W |
| C$_5$F$_{12}$ gas flow rate | 20 mL/min |
| C$_2$F$_6$ gas flow rate | 10 mL/min |
| Ar gas flow rate | 300 mL/min |
| O$_2$ gas flow rate | 60 mL/min |
| Time | 90 sec |

In Comparative Example 2, after transferring the resist pattern to the silicon oxide film under the condition (a), the silicon oxide film pattern was transferred to the under layer film under the condition (d), and the under layer film pattern was further transferred to the SiO$_2$ film under the condition (e), whereby processing the layer to be processed.

Pattern cross sectional shapes of the substrates of Examples 1 to 15 and Comparative Examples 1 and 2 in which the layers to be processed had been processed as mentioned above were observed by an electron microscope (S-4700; manufactured by Hitachi, Ltd.), and their shapes were compared. The results are shown in Table 9.

TABLE 9

| | Under layer film | Metal oxide film | Hydro-carbon film | Silicon oxide film | Photo-resist film | Pattern shape after transfer etching to substrate |
|---|---|---|---|---|---|---|
| Example 1 | UDL-1 | MHL-1 | HCL-1 | SOG-1 | ArF resist-1 | Rectangular |
| Example 2 | UDL-2 | MHL-1 | HCL-1 | SOG-1 | ArF resist-1 | Rectangular |
| Example 3 | UDL-3 | MHL-1 | HCL-1 | SOG-1 | ArF resist-1 | Rectangular |
| Example 4 | UDL-4 | MHL-1 | HCL-1 | SOG-1 | ArF resist-1 | Rectangular |
| Example 5 | UDL-5 | MHL-1 | HCL-1 | SOG-1 | ArF resist-1 | Rectangular |
| Example 6 | UDL-6 | MHL-1 | HCL-1 | SOG-1 | ArF resist-1 | Rectangular |
| Example 7 | UDL-7 | MHL-1 | HCL-1 | SOG-1 | ArF resist-1 | Rectangular |
| Example 8 | UDL-8 | MHL-1 | HCL-1 | SOG-1 | ArF resist-1 | Rectangular |
| Example 9 | UDL-8 | MHL-2 | HCL-1 | SOG-1 | ArF resist-1 | Rectangular |
| Example 10 | UDL-8 | MHL-3 | HCL-1 | SOG-1 | ArF resist-1 | Rectangular |
| Example 11 | UDL-8 | MHL-4 | HCL-1 | SOG-1 | ArF resist-1 | Rectangular |
| Example 12 | UDL-1 | MHL-1 | HCL-2 | SOG-1 | ArF resist-1 | Rectangular |
| Example 13 | UDL-1 | MHL-1 | HCL-3 | SOG-1 | ArF resist-1 | Rectangular |
| Example 14 | UDL-9 | MHL-1 | HCL-1 | SOG-1 | ArF resist-1 | Rectangular |
| Example 15 | UDL-10 | MHL-1 | HCL-1 | SOG-1 | ArF resist-1 | Rectangular |
| Comparative example 1 | Comparative UDL-1 | MHL-1 | HCL-1 | SOG-1 | ArF resist-1 | Tapered shape |
| Comparative example 2 | UDL-1 | None | None | SOG-1 | ArF resist-1 | Pattern collapse |

As shown in Table 9, in Examples 1 to 15 in which the pattern has been formed by the penta-layer process using the multi-layer film formed by the method for forming a multi-layer film of the present invention as a resist under layer film, a pattern having a cross sectional shape of rectangular could be obtained.

In Examples 1 to 15, as shown in Tables 6 and 7, a metal oxide film such as a titanium oxide film, a zirconium oxide film, and a hafnium oxide film was formed on the under layer film that causes little reduction of the film even when it is baked at a high temperature of 350° C. or 450° C., and the hydrocarbon film and the silicon oxide film having refractive indexes (antireflection effect) as shown in Table 8 were formed thereon. According to this constitution, light is totally reflected on the metal oxide film, and substrate reflection can be reduced by two-layered antireflection film composed of the hydrocarbon film and the silicon oxide film formed thereon. In addition, since the substrate reflection can be suppressed even when the film thickness of the silicon oxide film just below the resist is thinned, the resist pattern can be smoothly transferred by dry etching to the silicon oxide film. Further, the shape of the pattern of the substrate to be processed as the base material after dry etching becomes good because of excellent dry etching resistance of the metal oxide film.

On the other hand, in Comparative Example 1 in which Comparative UDL-1 was used as the under layer film material, a cross sectional shape of the pattern was tapered as shown in Table 9. Also, in Comparative Example 2 in which neither the metal oxide film nor the hydrocarbon film had been formed (tri-layer process), pattern collapse occurred as shown in Table 9.

From the results as mentioned above, when formation of the pattern is carried out by the penta-layer process using the multi-layer film formed by the method for forming a multi-layer film of the present invention, it is excellent in antireflection effect than the conventional tri-layer process, and excellent in selectivity of dry etching, so that a pattern with good shape can be formed.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for forming a multi-layer film on a substrate, comprising the steps of:
   (1) forming an under layer film on the substrate by applying an under layer film material containing a resin having a repeating unit represented by the general formula (1) or (2) in which a fluorene structure is contained, and curing the same by heat treatment;
   (2) forming a metal oxide film on the under layer film by applying a metal oxide film material selected from a titanium oxide film material, a zirconium oxide film material, and a hafnium oxide film material;
   (3) forming a hydrocarbon film on the metal oxide film by applying a hydrocarbon film material; and
   (4) forming a silicon oxide film on the hydrocarbon film by applying a silicon oxide film material,

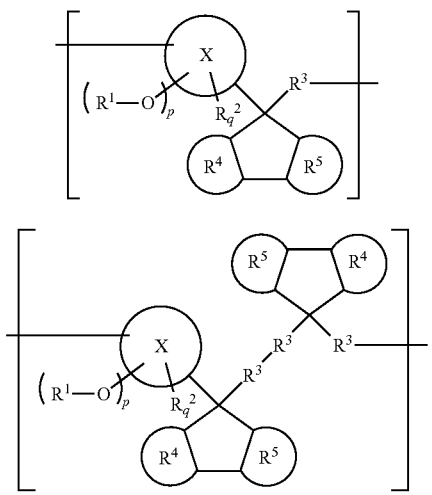

wherein X represents a benzene ring, a naphthalene ring, or a carbazole ring; $R^1$ represents a hydrogen atom, a glycidyl group, a linear, branched, or cyclic alkyl group having 1 to 10 carbon atoms, an aryl group having 6 to 20 carbon atoms, or an alkenyl group having 2 to 20 carbon atoms; $R^2$ represents a hydrogen atom, a linear, branched, or cyclic alkyl group having 1 to 10 carbon atoms, an aryl group having 6 to 10 carbon atoms, or an alkenyl group having 2 to 6 carbon atoms; each $R^3$ independently represents a single bond, an alkylene group having 1 to 20 carbon atoms, an alkenylene group having 2 to 20 carbon atoms, or an arylene group having 6 to 20 carbon atoms, and optionally contains one or more groups selected from an ether group, an ester group, a hydroxyl group, a carboxyl group, an alkoxy group, and a glycidylether group; $R^4$ and $R^5$ independently represent a benzene ring or a naphthalene ring, and a hydrogen atom(s) in the benzene ring or the naphthalene ring may be substituted by a hydrocarbon group having 1 to 6 carbon atoms; and "p" and "q" independently represent an integer of 0 to 2.

2. The method for forming a multi-layer film according to claim 1, wherein the heat treatment in the step (1) is carried out at a temperature of 250° C. or higher and 800° C. or lower for 10 seconds to 4,000 seconds.

3. The method for forming a multi-layer film according to claim 2, wherein the heat treatment in the step (1) is carried out at a temperature of 250° C. or higher and 700° C. or lower for 10 seconds to 600 seconds.

4. The method for forming a multi-layer film according to claim 3, wherein applying of the materials in the steps (1) to (4) is carried out by a spin coating method.

5. The method for forming a multi-layer film according to claim 4, wherein the under layer film having a film thickness of 30 to 20,000 nm is formed in the step (1), the metal oxide film having a film thickness of 3 to 100 nm is formed in the step (2), the hydrocarbon film having a film thickness of 5 to 100 nm is formed in the step (3), and the silicon oxide film having a film thickness of 10 to 20 nm is formed in the step (4).

6. The method for forming a multi-layer film according to claim 3, wherein the under layer film having a film thickness of 30 to 20,000 nm is formed in the step (1), the metal oxide film having a film thickness of 3 to 100 nm is formed in the step (2), the hydrocarbon film having a film thickness of 5 to 100 nm is formed in the step (3), and the silicon oxide film having a film thickness of 10 to 20 nm is formed in the step (4).

7. The method for forming a multi-layer film according to claim 2, wherein applying of the materials in the steps (1) to (4) is carried out by a spin coating method.

8. The method for forming a multi-layer film according to claim 7, wherein the under layer film having a film thickness of 30 to 20,000 nm is formed in the step (1), the metal oxide film having a film thickness of 3 to 100 nm is formed in the step (2), the hydrocarbon film having a film thickness of 5 to 100 nm is formed in the step (3), and the silicon oxide film having a film thickness of 10 to 20 nm is formed in the step (4).

9. The method for forming a multi-layer film according to claim 2, wherein the under layer film having a film thickness of 30 to 20,000 nm is formed in the step (1), the metal oxide film having a film thickness of 3 to 100 nm is formed in the step (2), the hydrocarbon film having a film thickness of 5 to 100 nm is formed in the step (3), and the silicon oxide film having a film thickness of 10 to 20 nm is formed in the step (4).

10. The method for forming a multi-layer film according to claim 1, wherein applying of the materials in the steps (1) to (4) is carried out by a spin coating method.

11. The method for forming a multi-layer film according to claim 10, wherein the under layer film having a film thickness of 30 to 20,000 nm is formed in the step (1), the metal oxide film having a film thickness of 3 to 100 nm is formed in the step (2), the hydrocarbon film having a film thickness of 5 to 100 nm is formed in the step (3), and the silicon oxide film having a film thickness of 10 to 20 nm is formed in the step (4).

12. The method for forming a multi-layer film according to claim 1, wherein the under layer film having a film thickness of 30 to 20,000 nm is formed in the step (1), the metal oxide film having a film thickness of 3 to 100 nm is formed in the step (2), the hydrocarbon film having a film thickness of 5 to 100 nm is formed in the step (3), and the silicon oxide film having a film thickness of 10 to 20 nm is formed in the step (4).

13. A patterning process comprising the steps of:
   (A) forming a photoresist film on a multi-layer film which has been formed on a substrate by the method for forming a multi-layer film according to claim 1;
   (B) forming a photoresist pattern by subjecting the photoresist film to exposure and development;
   (C) transferring the pattern to the silicon oxide film by dry etching using the photoresist pattern as a mask;
   (D) transferring the pattern to the hydrocarbon film by dry etching using the silicon oxide film to which the pattern has been transferred as a mask;
   (E) transferring the pattern to the metal oxide film by dry etching using the hydrocarbon film to which the pattern has been transferred as a mask; and
   (F) transferring the pattern to the under layer film by dry etching using the metal oxide film to which the pattern has been transferred as a mask.

14. The patterning process according to claim 13, wherein the dry etching in the step (F) is carried out by using one or more etching gases selected from an oxygen gas, a hydrogen gas, an ammonia gas, a carbon dioxide gas, a carbon monoxide gas, and a sulfur dioxide gas.

15. A patterning process comprising the steps of:
   (A) forming a photoresist film on a multi-layer film which has been formed on a substrate by the method for forming a multi-layer film according to claim 2;

(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the metal oxide film by dry etching using the hydrocarbon film to which the pattern has been transferred as a mask; and
(F) transferring the pattern to the under layer film by dry etching using the metal oxide film to which the pattern has been transferred as a mask.

16. The patterning process according to claim 15, wherein the dry etching in the step (F) is carried out by using one or more etching gases selected from an oxygen gas, a hydrogen gas, an ammonia gas, a carbon dioxide gas, a carbon monoxide gas, and a sulfur dioxide gas.

17. A patterning process comprising the steps of:
(A) forming a photoresist film on a multi-layer film which has been formed on a substrate by the method for forming a multi-layer film according to claim 3;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the metal oxide film by dry etching using the hydrocarbon film to which the pattern has been transferred as a mask; and
(F) transferring the pattern to the under layer film by dry etching using the metal oxide film to which the pattern has been transferred as a mask.

18. The patterning process according to claim 17, wherein the dry etching in the step (F) is carried out by using one or more etching gases selected from an oxygen gas, a hydrogen gas, an ammonia gas, a carbon dioxide gas, a carbon monoxide gas, and a sulfur dioxide gas.

19. A patterning process comprising the steps of:
(A) forming a photoresist film on a multi-layer film which has been formed on a substrate by the method for forming a multi-layer film according to claim 10;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the metal oxide film by dry etching using the hydrocarbon film to which the pattern has been transferred as a mask; and
(F) transferring the pattern to the under layer film by dry etching using the metal oxide film to which the pattern has been transferred as a mask.

20. A patterning process comprising the steps of:
(A) forming a photoresist film on a multi-layer film which has been formed on a substrate by the method for forming a multi-layer film according to claim 12;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the metal oxide film by dry etching using the hydrocarbon film to which the pattern has been transferred as a mask; and
(F) transferring the pattern to the under layer film by dry etching using the metal oxide film to which the pattern has been transferred as a mask.

* * * * *